United States Patent
Lee et al.

(10) Patent No.: US 11,464,107 B2
(45) Date of Patent: Oct. 4, 2022

(54) BOARD INCLUDING MULTIPLE CONDUCTIVE PADS CORRESPONDING TO ONE CONTACT, AND ELECTRONIC DEVICE FOR IDENTIFYING CONDUCTIVE PADS

(71) Applicant: SAMSUNG ELECTRONICS CO., LTD., Suwon-si (KR)

(72) Inventors: Chihwei Lee, Suwon-si (KR); Jungmin Park, Suwon-si (KR); Chonghwa Seo, Suwon-si (KR); Sungcheol Yoo, Suwon-si (KR); Jongwon Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 521 days.

(21) Appl. No.: 16/583,770

(22) Filed: Sep. 26, 2019

(65) Prior Publication Data

US 2020/0107434 A1    Apr. 2, 2020

(30) Foreign Application Priority Data

Sep. 28, 2018 (KR) .......................... 10-2018-0116140

(51) Int. Cl.
*H05K 1/02* (2006.01)
*G01R 1/06* (2006.01)
(Continued)

(52) U.S. Cl.
CPC ....... *H05K 1/0268* (2013.01); *G01R 1/06794* (2013.01); *G01R 31/2808* (2013.01); (Continued)

(58) Field of Classification Search
CPC .... H05K 1/0268; H05K 1/18; G01R 1/06794; G01R 3/2808
See application file for complete search history.

(56) References Cited

U.S. PATENT DOCUMENTS

2006/0145717 A1   7/2006 Yun
2009/0224786 A1   9/2009 Wu et al.
(Continued)

FOREIGN PATENT DOCUMENTS

WO    2017/026867    2/2017

OTHER PUBLICATIONS

Extended Search Report and Written Opinion dated Feb. 25, 2020 in counterpart EuropeanPatent Application No. 19199957.2.

*Primary Examiner* — Jeremy C Norris
(74) *Attorney, Agent, or Firm* — Nixon & Vanderhye, P.C.

(57) ABSTRACT

An electronic device according to various embodiments may include: a board; a communication circuit disposed on one face of the board and configured to process a communication signal in a designated frequency band; an antenna disposed on the one face of the board or inside the board; a connector disposed on another face of the board, and including a first contact electrically connected to a first signal path through which the communication circuit is configured to transmit a signal to the antenna in a first direction, and a second contact electrically connected to a second signal path through which the communication circuit configured to transmit a signal to the antenna in a second direction; and conductive pads disposed on the another face of the board spaced apart from the connector, and including at least two first pads corresponding to the first contact and at least two second pads corresponding to the second contact.

20 Claims, 18 Drawing Sheets

(51) Int. Cl.
  *G01R 1/067* (2006.01)
  *G01R 31/28* (2006.01)
  *H01Q 23/00* (2006.01)
  *H04B 1/40* (2015.01)
  *H05K 1/18* (2006.01)

(52) U.S. Cl.
  CPC ............... *H01Q 23/00* (2013.01); *H04B 1/40* (2013.01); *H05K 1/18* (2013.01); *H05K 2201/09409* (2013.01); *H05K 2201/09427* (2013.01); *H05K 2201/10189* (2013.01)

(56) References Cited

U.S. PATENT DOCUMENTS

| | | |
|---|---|---|
| 2010/0178778 A1 | 7/2010 | Satou et al. |
| 2010/0240259 A1 | 9/2010 | Murphy et al. |
| 2012/0262188 A1 | 10/2012 | Nickel et al. |
| 2015/0381140 A1 | 12/2015 | Embar et al. |
| 2017/0033441 A1 | 2/2017 | Son et al. |
| 2018/0115333 A1 | 4/2018 | Takayama et al. |

BOARD INCLUDING MULTIPLE CONDUCTIVE PADS CORRESPONDING TO ONE CONTACT, AND ELECTRONIC DEVICE FOR IDENTIFYING CONDUCTIVE PADS

CROSS-REFERENCE TO RELATED APPLICATION

This application is based on and claims priority under 35 U.S.C. § 119 to Korean Patent Application No. 10-2018-0116140, filed on Sep. 28, 2018, in the Korean Intellectual Property Office, the disclosure of which is incorporated by reference herein in its entirety.

TECHNICAL FIELD

The disclosure relates to a board including multiple conductive pads corresponding to one contact, and to an electronic device connected to the conductive pads for determining performance.

BACKGROUND

An electronic device may output information stored therein as sound or an image. As the degree of integration of electronic devices has increased and super-high-speed and large-capacity RF communication have become popular, various functions have recently been provided in a single electronic device, such as a mobile communication terminal. For example, various functions, such as an entertainment function (e.g., a game function), a multimedia function (e.g., a music/video reproducing function), a communication and security function for mobile banking, a schedule management function, and an e-wallet function, are integrated in a single electronic device, in addition to a communication function.

In communication devices mounted in electronic devices, efforts are underway to develop a next-generation communication system such as a next-generation (e.g., $5^{th}$ generation) communication system or a pre-next-generation communication system in order to meet the growing demand for RF data traffic, which is in an increasing trend after the commercialization of a 4G ($4^{th}$ generation) communication system.

In order to achieve a high data transmission rate, the next-generation communication system is being implemented in an ultra-high-frequency band (e.g., a band of 6 GHz or higher and 300 GHz or lower) such as a millimeter (mm) wave band. In order to mitigate a path loss of radio waves and to increase the transmission distance of radio waves in the ultra-high-frequency band, beamforming technology, massive multi-input multi-output (massive MIMO) technology, full dimensional MIMO (FD-MIMO) technology, antenna array technology, analog beamforming technology, and large-scale antenna technology are being developed in the next-generation communication system.

An antenna structure to be used in next-generation communications (e.g., mmWave communication) may also be affected by small variations in manufacturing due to the sensitivity of RF characteristics. For example, next-generation communication antennas may exhibit different levels of performance when a manufacturing defect occurs, even if the communication antennas have the same structure. In general, in order to accurately test the performance of an antenna structure, it is possible to electrically connect RF measurement equipment to a connector of the antenna structure and to determine the degree of signal loss (e.g., insertion loss of a designated frequency band).

When a connector of the RF measurement equipment is connected to a connector of an antenna structure, the connectors may be damaged and the time required may be excessive due to the repeated connection and disconnection of the connectors. For example, in order to test an RF signal, it is necessary to perform the connection and disconnection of all the connectors even though only some of the contacts of the antenna connector need to be grounded. As a result, other contacts in the connector are frequently damaged, which may result in wasted time and expense due to damage and/or replacement of the connector.

SUMMARY

According to various embodiments, it is possible to prevent and/or reduce damage caused by disconnection and connection of connectors by separately disposing conductive pads for contact connection with RF measurement equipment in an area around the connector disposed on a board. As another example, it is possible to reduce the time consumption for measurement by connecting a probe (e.g., a pogo pin) for RF measurement equipment to the measurement equipment.

According to various embodiments, it is possible to prevent and/or reduce damage caused detachment/connection of a connector by separately disposing conductive pads for contact connection with RF measurement equipment in an area around the connector disposed on a board.

An electronic device according to various example embodiments may include: a board; a communication circuit disposed on one face of the board and configured to process a communication signal in a designated frequency band; an antenna disposed on the one face of the board or inside the board; a connector disposed on another face of the board, and including a first contact electrically connected to a first signal path through which the communication circuit is configured to transmit a signal to the antenna in a first direction, and a second contact electrically connected to a second signal path through which the communication circuit is configured to transmit a signal to the antenna in a second direction; and conductive pads disposed on the another face of the board and spaced apart from the connector, the conductive pads including at least two first pads corresponding to the first contact and at least two second pads corresponding to the second contact.

An electronic device according to various example embodiments may include: a board; a communication structure comprising communication circuitry disposed on one face of the board and configured to process a communication signal in a designated frequency band among multiple designated frequency bands corresponding to a designated communication method; an antenna disposed on another face of the board or inside the board, and including at least one conductive plate; a connector disposed on the one face of the board and electrically connected to the communication structure, the connector including a first contact configured to supply a signal to the antenna in a designated direction and a second contact configured to supply a signal to the antenna in a direction different from the designated direction; and conductive pads spaced apart from the connector and including a first pad electrically connected to the first contact of the connector and a second pad electrically connected to the second contact of the connector.

A measurement apparatus according to various example embodiments may include: a first probe configured to be electrically connected to a first terminal of an external electronic device; a second probe configured to be electrically connected to the first terminal and configured to be electrically connected to a second terminal of the external electronic device disposed adjacent to the first terminal; a third probe configured to be electrically connected to a third terminal of the external electronic device, defining a signal path of a designated band with the first terminal; a processor configured to: transmit a first signal in the designated frequency band through the first probe to the external electronic device, acquire, through the third probe, a second signal generated based on the first signal passing through a signal path between the first terminal and the third terminal of the external electronic device, and determine whether the signal path is abnormal based on at least the first signal and the second signal; and one or more fourth probes configured to be connected to at least one ground terminal corresponding to a ground area of the external electronic device. At least some of the fourth probes adjacent to the second probe among the one or more fourth probes may be electrically connected to the second probe to have a designated length corresponding to the designated frequency band.

With an electronic device according to various example embodiments, it is possible to easily and conveniently determine the degree of RF signal loss (e.g., insertion loss of a designated frequency band) by separately disposing conductive pads for contact connection with RF measurement equipment in an area around a connector disposed on a board.

With an electronic device according to various example embodiments, it is possible to accurately measure a signal flow through RF measurement equipment by adjusting a separation distance between conductive pads disposed around the connector of the board.

With an electronic device according to various example embodiments, it is possible to prevent and/or reduce damage caused by disconnection and connection of connectors by separately disposing conductive pads for contact connection with RF measurement equipment in an area around the connector disposed on the board.

BRIEF DESCRIPTION OF THE DRAWINGS

The above and other aspects, features, and advantages of certain embodiments of the present disclosure will be more apparent from the following detailed description, taken in conjunction with the accompanying drawings, in which.

DETAILED DESCRIPTION

Figure 1:
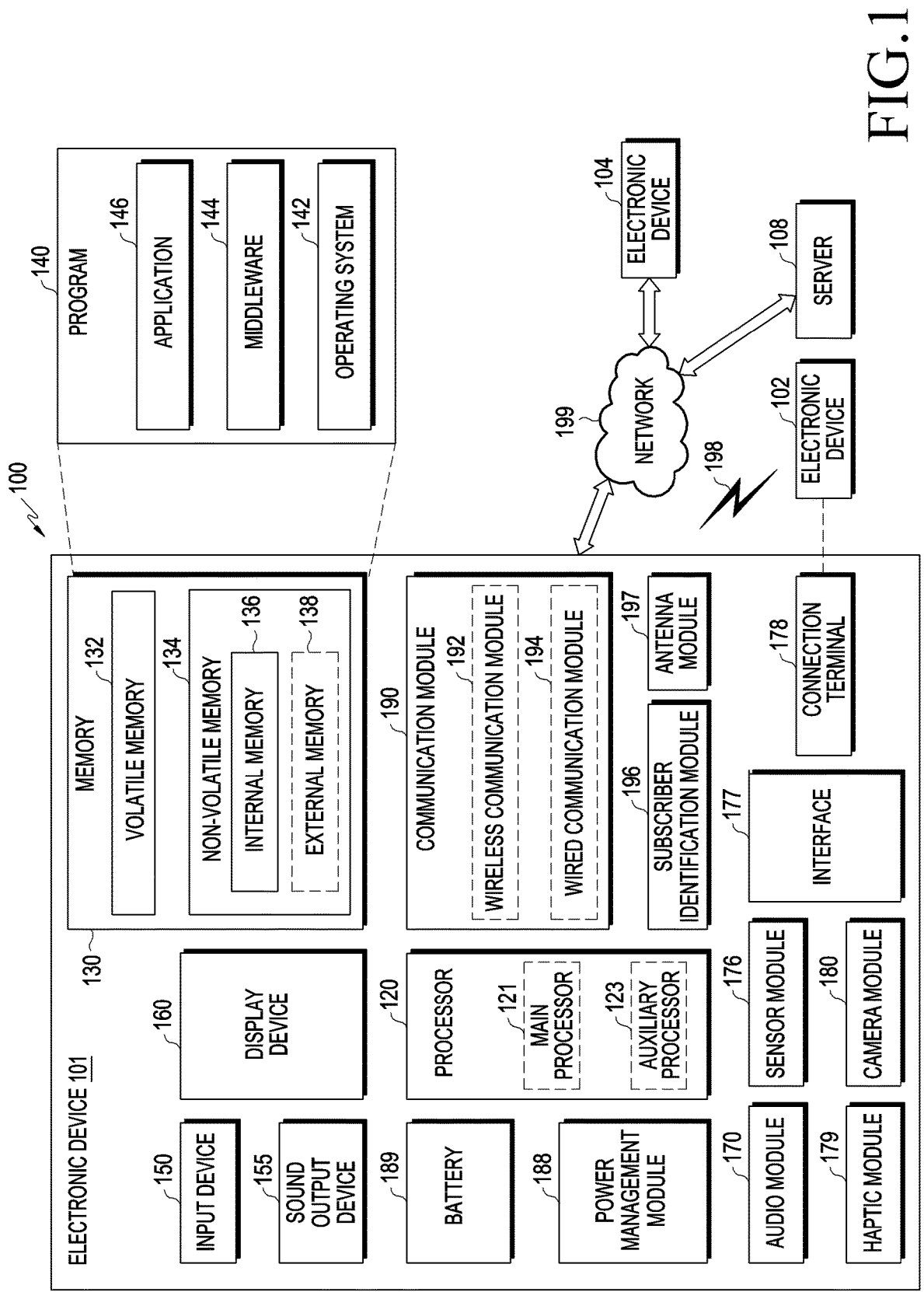
FIG. 1 is a block diagram of illustrating an example electronic device in a network environment according to various embodiments.

FIG. 1 is a block diagram illustrating an electronic device 101 in a network environment 100 according to various embodiments.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his or her tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., PCB). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked.

The one or more instructions may include a code generated by a complier or a code executable by an interpreter. The machine-readable storage medium may be provided in the form of a non-transitory storage medium. Wherein, the "non-transitory" is a tangible device, but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
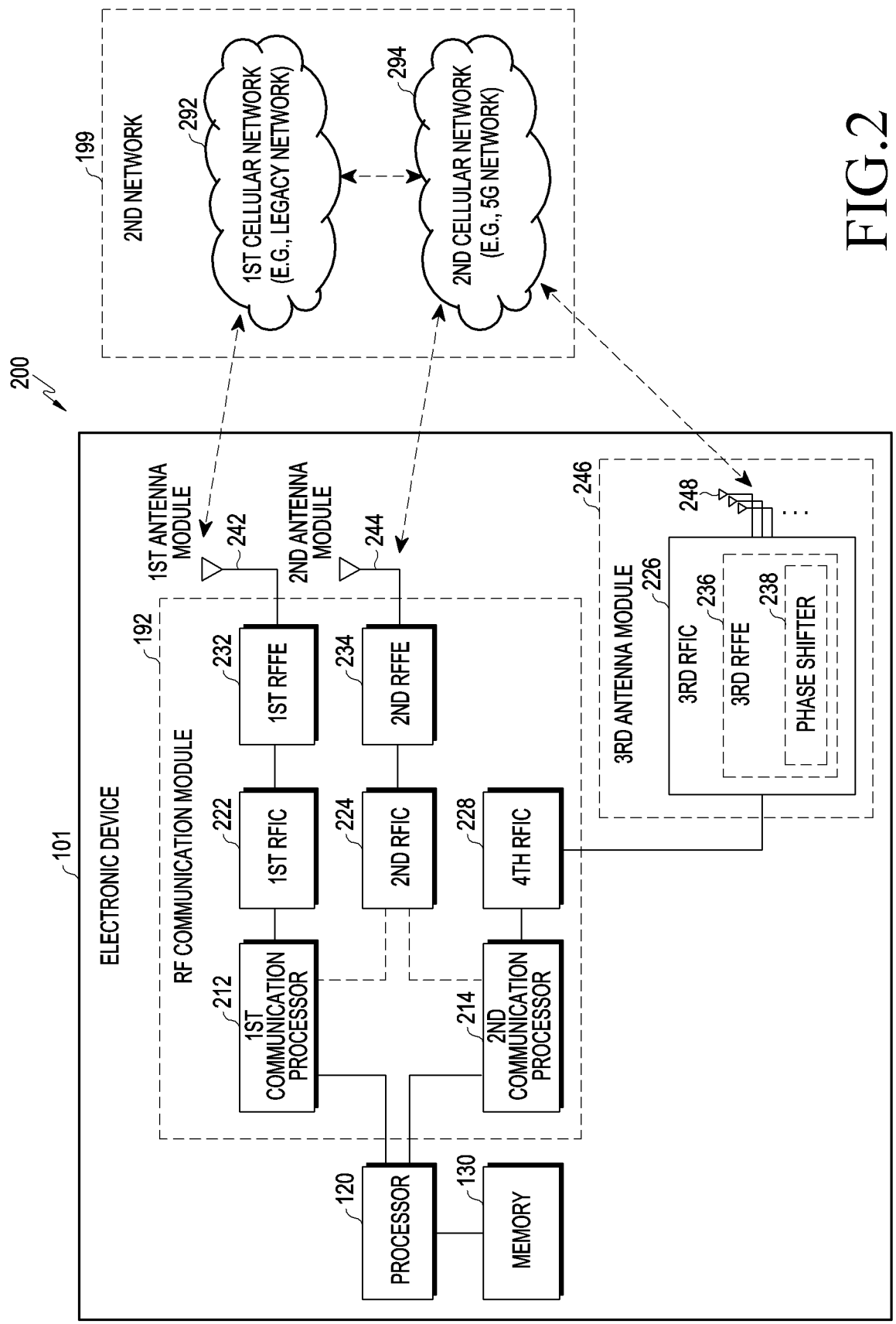
FIG. 2 is a block diagram illustrating an example electronic device in a network environment including multiple cellular networks according to various embodiments.

FIG. 2 is a block diagram 200 illustrating an example electronic device 101 in a network environment including multiple cellular networks according to various embodiments.

Referring to FIG. 2, the electronic device 101 may include a first communication processor (e.g., including processing circuitry) 212, a second communication processor (e.g., including processing circuitry) 214, a first radio frequency integrated circuit (RFIC) 222, a second RFIC 224, a third RFIC 226, a fourth RFIC 228, a first radio frequency front end (RFFE) (e.g., including radio frequency circuitry) 232, a second RFFE (e.g., including radio frequency circuitry) 234, a first antenna module (e.g., including an antenna) 242, a second antenna module (e.g., including an antenna) 244, and an antenna 248. The electronic device 101 may further include a processor (e.g., including processing circuitry) 120 and memory 130. The second network 199 may include a first cellular network 292 and a second cellular network 294. According to another embodiment, the electronic device 101 may further include at least one of the components illustrated in FIG. 2, and the second network 199 may further include at least one other network. According to an embodiment, the first communication processor 212, the second communication processor 214, the first RFIC 222, the second RFIC 224, the fourth RFIC 228, the first RFFE 232, and the second RFFE 234 may comprise at least a part of an RF communication module 192. According to another embodiment, the fourth RFIC 228 may be omitted, or may be included as a part of the third RFIC 226.

According to various embodiments, the first communication processor 212 may include various communication processing circuitry and establish a communication channel in a band to be used for RF communication with the first cellular network 292, and may support legacy network communication over the established communication channel. According to various embodiments, the first cellular network may be a legacy network including, for example, and without limitation, a second generation (2G), 3G, 4G, long-term-evolution (LTE) network, or the like. The second communication processor 214 may include various communication processing circuitry and establish a communication channel corresponding to a designated band (e.g., about 6 GHz to about 60 GHz) in a band to be used for RF communication with the second cellular network 294, and may support 5G network communication through the established communication channel. According to various embodiments, the second cellular network 294 may, for example, and without limitation, be a 5G network defined in the 3GPP. In addition, according to an embodiment, the first communication processor 212 and/or the second communication processor 214 may establish a communication channel corresponding to another designated band (e.g., about 6 GHz or lower) in the band to be used for RF communication with the second cellular network 294, and may support 5G network communication through the established communication channel. According to an embodiment, the first communication processor 212 and the second communication processor 214 may be implemented in a single chip or in a single package. According to various embodiments, the first communication processor 212 and/or the second communication processor 214 may be formed in a single chip or a single package with the processor 120, an auxiliary processor 123, and/or a communication module 190.

According to an embodiment, during transmission, the first RFIC 222 may convert a baseband signal generated by the first communication processor 212 into an RF signal ranging, for example, from about 700 MHz to about 3 GHz to be used in the first cellular network 292 (e.g., a legacy network). During reception, an RF signal may be acquired from the first cellular network 292 (e.g., the legacy network) through an antenna (e.g., the first antenna module 242) and may be pre-processed through an RFFE (e.g., the first RFFE 232). The first RFIC 222 may convert the pre-processed RF signal into a baseband signal to be processed by the first communication processor 212.

According to an embodiment, during transmission, the second RFIC 224 may convert the baseband signal generated by the first communication processor 212 and/or the second communication processor 214 into an RF signal in, for example, a Sub6 band (e.g., about 6 GHz or lower) (hereinafter, referred to as "5G Sub6 RF signal") to be used in the second cellular network 294 (e.g., a 5G network). During reception, the 5G Sub6 RF signal may be acquired from the second cellular network 294 (e.g., a 5G network) through an antenna (e.g., the second antenna module 244), and may be pre-processed through an RFFE (e.g., the second RFFE 234). The second RFIC 224 may convert the pre-processed 5G Sub6 RF signal into a baseband signal so as to be processed by a corresponding one of the first communication processor 212 and the second communication processor 214.

According to an embodiment, the third RFIC 226 may convert the baseband signal generated by the second communication processor 214 into an RF signal in a 5G Above6 band (e.g., about 6 GHz to about 60 GHz) (hereinafter, referred to as "5G Above6 RF signal") to be used in the second cellular network 294 (e.g., a 5G network). During reception, the 5G Above6 RF signal may be acquired from the second cellular network 294 (e.g., a 5G network) through an antenna (e.g., the second antenna module 248), and may be pre-processed through the third RFFE 236. The third RFIC 226 may convert the pre-processed 5G Above6 RF signal into a baseband signal to be processed by the second communication processor 214. According to an embodiment, the third RFFE 236 may be formed as a part of the third RFIC 226.

According to an embodiment, the electronic device 101 may include a fourth RFIC 228 separately from or as at least a part of the third RFIC 226. In this case, the fourth RFIC 228 may convert a baseband signal generated by the second communication processor 214 into an RF signal (hereinafter, referred to as "IF signal") in an intermediate frequency band (e.g., about 9 GHz to about 11 GHz), and may then deliver the IF signal to the third RFIC 226. The third RFIC 226 may convert the IF signal into a 5G Above6 RF signal. During reception, the 5G Above6 RF signal may be acquired from the second cellular network 294 (e.g., a 5G network) through an antenna (e.g., the antenna 248), and may be configured into an IF signal through the third RFIC 226. The fourth RFIC 228 may convert the IF signal into a baseband signal to be processed by the second communication processor 214.

According to an embodiment, the first RFIC 222 and the second RFIC 224 may be implemented as at least a part of a single chip or a single package. According to an embodiment, the first RFFE 232 and the second RFFE 234 may be implemented as at least a part of a single chip or a single package. According to an embodiment, at least one of the first antenna module 242 and the second antenna module 244 may be omitted or combined with another antenna module so as to process RF signals of multiple corresponding bands.

According to an embodiment, the third RFIC 226 and the antenna 248 may be disposed on the same substrate to comprise a third antenna module 246. For example, the RF communication module 192 and/or the processor 120 may be placed on a first substrate (e.g., a main PCB). In such a case, the third RFIC 226 may be disposed on a partial area (e.g., a lower face) of a second substrate (e.g., a sub-PCB) separate from the first substrate, and the antenna 248 may be disposed on another partial area (e.g., an upper face), thereby forming the antenna module 246. By disposing the third RFIC 226 and the antenna 248 on the same substrate, it is possible to reduce the length of the transmission line therebetween. Thus, it may be possible to reduce the loss (e.g., attenuation) of a signal in an RF band (e.g., about 6 GHz to about 60 GHz) to be used, for example, for 5G network communication by the transmission line. As a result, the electronic device 101 is able to improve the quality or speed of communication with the second cellular network 294 (e.g., a 5G network).

According to an embodiment, the antenna 248 may be an antenna array including multiple antenna elements that are capable of being used for beamforming. In this case, the third RFIC 226 may include multiple phase shifters 238 corresponding to the multiple antenna elements, for example, as a part of the third RFFE 236. During transmission, each of the multiple phase shifters 238 may convert the phase of a 5G Above6 RF signal to be transmitted to the outside of the electronic device 101 (e.g., a base station of a 5G network) through a corresponding antenna element. During reception, each of the multiple phase shifters 238 may convert the phase of the 5G Above6 RF signal received from the outside into the same or substantially the same phase through the corresponding antenna element. This enables transmission or reception through beamforming between the electronic device 101 and the outside.

According to various embodiments, the second cellular network 294 (e.g., a 5G network) may be operated independently from the first cellular network 292 (e.g., a legacy network) (e.g., Stand-Alone (SA)), or may be operated in the state of being connected to the first cellular network 292 (e.g., Non-Stand Alone (NSA)). For example, in a 5G network, only an access network (e.g., a 5G radio access network (RAN) or a next-generation RAN (NG RAN)) may exist but a core network (e.g., a next-generation core (NGC)) may not exist. In this case, after accessing the access network of the 5G network, the electronic device 101 may access an external network (e.g., the Internet) under the control of the core network (e.g., an evolved packet core (EPC)) of a legacy network. Protocol information for communication with a legacy network (e.g., LTE protocol information) or protocol information for communication with a 5G network (e.g., new radio (NR) protocol information) may be stored in the memory 230, and may be accessed by another component (e.g., the processor 120, the first communication processor 212, or the second communication processor 214).

Figure 3:
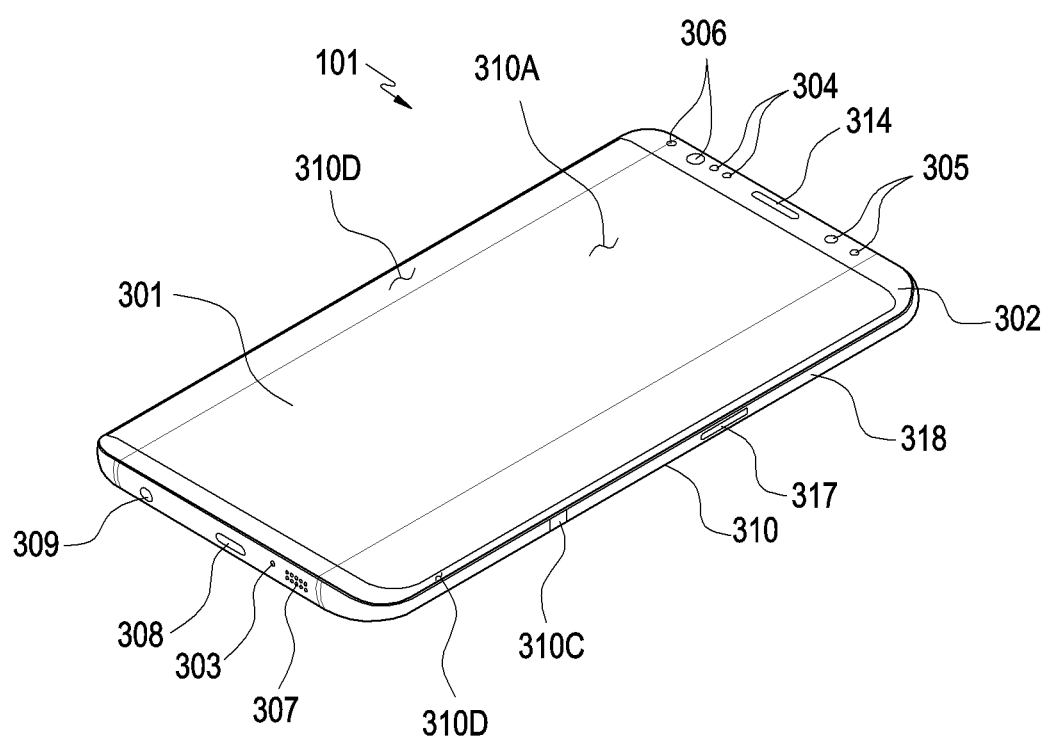
FIG. 3 is a front side perspective view illustrating an example electronic device according to various embodiments.
Figure 4:
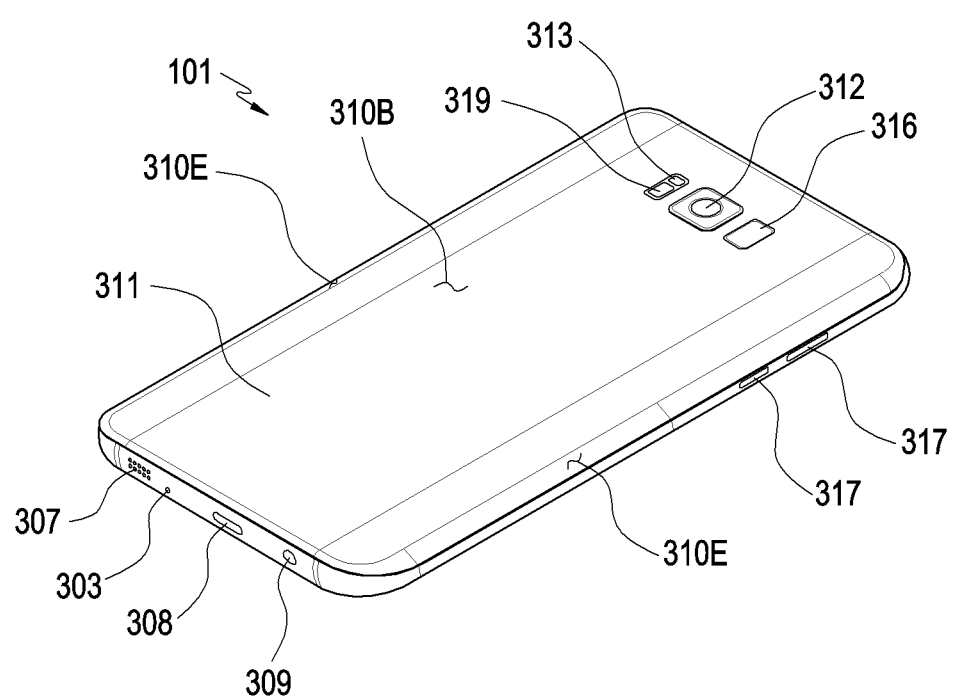
FIG. 4 is a rear side perspective view illustrating an example electronic device according to various embodiments.

FIG. 3 is a front side perspective view illustrating an example electronic device 101 according to various embodiments. FIG. 4 is a rear perspective view illustrating the example electronic device 101 according to various embodiments.

Referring to FIGS. 3 and 4, the electronic device 101 according to an embodiment may include a housing 310 including a first face (or a front face) 310A, a second face (or a rear face) 310B, and a side face 310C surrounding the space between the first face 310A and the second face 310B. In another embodiment (not illustrated), the term "housing" may refer, for example, to a structure forming a part of the first face 310A, the second face 310B, and the side faces 310C of FIG. 3. According to an embodiment, at least a portion of the first face 310A may be include a substantially transparent front plate 302 (e.g., a glass plate or a polymer plate including various coating layers). The second face 310B may include a substantially opaque rear plate 311. The rear plate 311 may, for example, and without limitation, include coated or colored glass, ceramic, a polymer, a metal (e.g., aluminum, stainless steel (STS), or magnesium), or a combination of two or more of these materials. The side face 310C may include a side bezel structure (or a "side member") 318 coupled to the front plate 302 and the rear plate 311 and including a metal and/or a polymer. In some embodiments, the rear plate 311 and the side bezel structure 318 may be integrally formed, and may include the same material (e.g., a metal material such as aluminum).

In the illustrated embodiment, the front plate 302 may include, at the long opposite side edges thereof, two first areas 310D, which may be bent from the first face 310A toward the rear plate 311 and extend seamlessly. In the illustrated embodiment (see FIG. 4), the rear plate 311 may include, at the long opposite side edges thereof, two second areas 310E, which may be bent from the second face 310B toward the front plate 302 and extend seamlessly. In some embodiments, the front plate 302 (or the rear plate 311) may include only one of the first areas 310D (or the second areas 310E). In another embodiment, some of the first areas 310D and the second areas 310E may not be included. In the above-described embodiments, when viewed from a side of the electronic device 101, the side bezel structure 318 may have a first thickness (or width) on the side faces, which do not include the first areas 310D or the second areas 310E, and may have a second thickness (or width), which is smaller than the first thickness, on the side faces, which include the first areas 310D or the second areas 310E.

According to an embodiment, the electronic device 101 may include at least one of a display 301, audio modules 303, 307, and 314, sensor modules 304, 316, and 319, camera modules 305, 312, and 313, key input devices 317, light-emitting elements 306, and connector holes 308 and 309. In some embodiments, at least one of the components (e.g., the key input devices 317 or the light-emitting elements 306) may be omitted from the electronic device 101, or the electronic device 101 may additionally include other components.

According to an embodiment, the display 301 may be exposed through a large portion of, for example, the front plate 302. In some embodiments, at least a part of the display 301 may be exposed through the front plate 302 forming the first face 310A and the first areas 310D of the side face 310C. In some embodiments, the edges of the display 301 may be formed to be substantially the same as the contour shape of the front plate 302 adjacent thereto. In another embodiment (not illustrated), the distance between the outer contour of the display 301 and the outer contour of the front plate 302 may be substantially constant in order to enlarge the exposed area of the display 301.

In another embodiment (not illustrated), a recess or an opening may be formed in a part of a screen display area of the display 301, and at least one of the audio module 314, the sensor module 304, the camera module 305, and the light-emitting element 306 may be aligned with the recess or the opening. In another embodiment (not illustrated), at least one of the audio module 314, the sensor module 304, the camera module 305, the fingerprint sensor 316, and the light-emitting element 306 may be included in the rear face of the screen display area of the display 301. In another embodiment (not illustrated), the display 301 may be coupled to or disposed adjacent to a touch-sensing circuit, a pressure sensor that is capable of measuring the intensity of touch (pressure) and/or a digitizer that detects a magnetic-field-type stylus pen. In some embodiments, at least some of the sensor modules 304 and 519 and/or at least some of the key input devices 317 may be disposed in the first areas 310D and/or the second areas 310E.

According to an embodiment, the audio modules 303, 307, and 314 may include a microphone hole 303 and speaker holes 307 and 314. The microphone hole 303 may include a microphone disposed therein to capture external sound, and in some embodiments, multiple microphones may be disposed therein so as to detect the direction of sound. The speaker holes 307 and 314 may include an external speaker hole 307 and a phone-call receiver hole 314. In some embodiments, the speaker holes 307 and 314 and the microphone hole 303 may be implemented as a single hole, or a speaker may be included therein without the speaker holes 307 and 314 (e.g., a piezo speaker).

According to an embodiment, the sensor modules 304, 316, and 319 may generate an electrical signal or a data value corresponding to the internal state of operation or the external environmental conditions of the electronic device 101. The sensor modules 304, 316, and 319 may include, for example, a first sensor module 304 (e.g., a proximity sensor) and/or a second sensor module (not illustrated) (e.g., a fingerprint sensor) disposed on the first face 310A of the housing 310, and/or a third sensor module 319 (e.g., an HRM sensor) and/or a fourth sensor module 316 (e.g., a fingerprint sensor) disposed on the second face 310B of the housing 310. The fingerprint sensor may be disposed not only on the first face 310A of the housing 310 (e.g., the display 301), but also on the second face 310B. The electronic device 101 may further include at least one of sensor modules (not illustrated) such as, for example, and without limitation, a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, an illuminance sensor, or the like.

According to an embodiment, the camera modules 305, 312, and 313 may include, for example, a first camera device 305 disposed on the first face 310A of the electronic device 101, and a second camera device 312 and/or a flash 313 disposed on the second face 310B thereof. The camera modules 305 and 312 may include one or more lenses, an image sensor, and/or an image signal processor. The flash 313 may include, for example, a light-emitting diode or a xenon lamp. In some embodiments, two or more lenses (e.g., an infrared camera lens, a wide-angle lens, and a telephoto lens) and image sensors may be disposed on one face of the electronic device 101.

According to an embodiment, the key input devices 317 may be disposed on the side face 310C of the housing 310. In another embodiment, the electronic device 101 may not include some or all of the above-mentioned key input devices 317, and a key input device 317, which is not included therein, may be implemented in another form of a soft key or the like on the display 301. In some embodiments, the key input devices may include a sensor module 316 disposed on the second face 310B of the housing 310.

According to one embodiment, the light-emitting element 306 may be disposed on, for example, the first face 310A of the housing 310. The light-emitting element 306 may provide, for example, the status information of the electronic device 101 in an optical form. In another embodiment, the light-emitting element 306 may provide a light source that is interlocked with, for example, the operation of the camera module 305. The light-emitting element 306 may include, for example, an LED, an IR LED, and a xenon lamp.

The connector holes 308 and 309 may include a first connector hole 308 that is capable of accommodating a connector (e.g., a USB connector) for transmitting and receiving power and/or data to and from an external electronic device, and/or a second connector hole 309 that is capable of receiving a connector (e.g., an earphone jack) for transmitting and receiving an audio signal to and from an electronic device.

Figure 5:
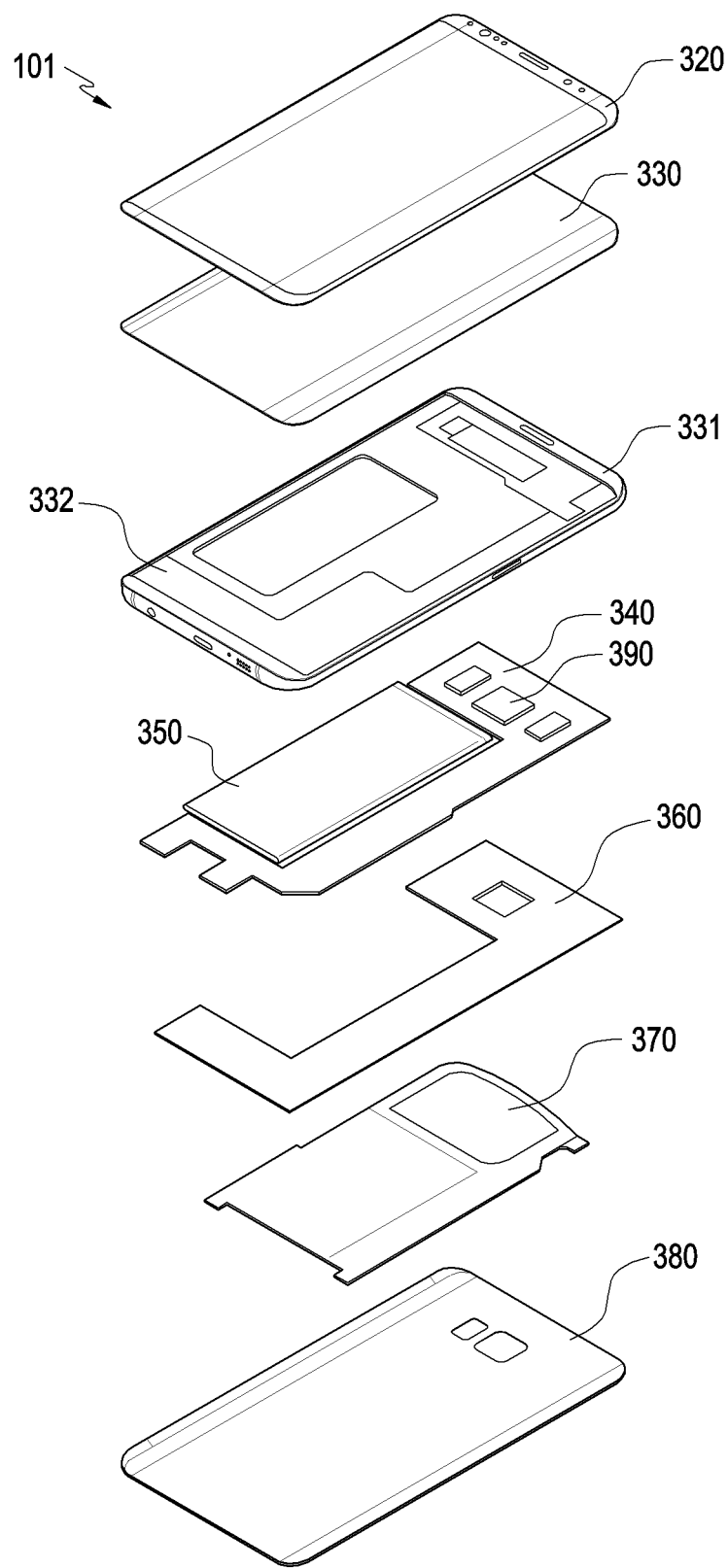
FIG. 5 is an exploded perspective view illustrating an example electronic device according to various embodiments.

FIG. 5 is an exploded perspective view illustrating an example electronic device 101 according to various embodiments.

Referring to FIG. 5, the electronic device 101 (e.g., the electronic device 101 in FIGS. 1 to 4) may include a side bezel structure 331, a first support member 332 (e.g., a bracket), a front plate 320, a display 330, a printed circuit board 340, a battery 350, a second support member 360 (e.g., a rear case), an antenna 370, and a rear plate 380. In some embodiments, at least one of the components (e.g., the first support member 332 or the second support member 360) may be omitted from the electronic device 101, or the electronic device 101 may additionally include other components. At least one of the components of the electronic device 101 may be the same as or similar to at least one of the components of the electronic device 101 of FIG. 4 or 5, and a redundant description thereof is omitted below.

According to an embodiment, the first support member 332 may be disposed inside the electronic device 101, and the first support member 332 may be connected to the side bezel structure 331, or may be integrally formed with the side bezel structure 331. The first support member 332 may be formed of, for example, a metal material and/or a non-metal (e.g., polymer) material. The display 330 may be coupled to one face of the first support member 332, and the printed circuit board 340 may be coupled to the other face of the first support member 332. On the printed circuit board 340, a processor, a memory, and/or an interface may be mounted. The processor may include at least one of, for example, a central processing unit, an application processor, a graphic processor, an image signal processor, a sensor hub processor, or a communication processor.

According to an embodiment, the memory may include, for example, volatile memory or nonvolatile memory.

According to an embodiment, the interface may include, for example, a high-definition multimedia interface (HDMI), a universal serial bus (USB) interface, an SD card interface, and/or an audio interface. The interface may electrically or physically connect, for example, the electronic device 101 to an external electronic device, and may include a USB connector, an SD card/an MMC (mobile module connector), or an audio connector.

According to an embodiment, the battery 350 is a device for supplying power to at least one component of the electronic device 101, and may include, for example, a non-rechargeable primary battery, a rechargeable secondary battery, or a fuel cell. At least a portion of the battery 350 may be disposed to be substantially flush with, for example, the printed circuit board 340. The battery 350 may be integrally disposed within the electronic device 101, or may be detachably mounted on the electronic device 101.

According to an embodiment, the antenna 370 may be disposed between the rear plate 380 and the battery 350. The antenna 370 may include, for example, a near-field communication (NFC) antenna, an RF charging antenna, and/or a magnetic secure transmission (MST) antenna. The antenna 370 is capable of, for example, performing short-range communication with an external device or transmitting and receiving power required for charging to and from an external device in a wireless manner. In another embodiment, an antenna structure may be formed by the side bezel structure 331, a portion of the first support member 332, or a combination thereof.

According to various embodiments, the electronic device may include multiple communication devices 390 For example, some of the multiple communication devices 390 may be implemented in order to transmit and receive radio waves having different characteristics (provisionally referred to as radio waves of A and B frequency bands) for MIMO implementation. As another example, some of the multiple communication devices 390 may be configured, for example, to simultaneously transmit and receive radio waves having the same characteristics (provisionally referred to as radio waves having A1 and A2 frequencies in the A frequency band) for diversity implementation. As another example, the remaining ones of the multiple communication devices 390 may be configured, for example, to simultaneously transmit and receive radio waves having the same characteristics (provisionally referred to as radio waves having B1 and B2 frequencies in the B frequency band) for diversity implementation. In an embodiment of the disclosure, the electronic device 101 may include two communication devices, but, in another embodiment of the disclosure, the electronic device 101 may include four communication devices so as to simultaneously implement MIMO and diversity. In another embodiment, the electronic device 101 may include only one communication device 390.

According to an embodiment, in consideration of the transmission/reception characteristics of radio waves, when one communication device is disposed at a first position on the printed circuit board 340, another communication device may be disposed at a second position, which is distant from the first position on the printed circuit board 340. As another example, one communication device and another communication device may be arranged in consideration of the mutual separation distance between the one communication device and the other communication device according to a diversity characteristic.

According to an embodiment, at least one communication device 390 may include an RF communication circuit that processes radio waves transmitted/received in an ultra-high-frequency band (e.g., 6 GHz or higher and 300 GHz or lower). The radiation conductor(s) (e.g., the radiation conductors 690 in FIG. 7A) of the at least one communication device 390 may include, for example, a patch-type radiation conductor or a radiation conductor having a dipole structure extending in one direction, and multiple radiation conductors may be arrayed to form an antenna array. For example, a chip in which some of the RF communication circuits are implemented (e.g., an integrated circuit chip) may be disposed on one side of the area in which the radiation conductor is disposed or on the face that faces away from the face on which the radiation conductor is disposed, and may be electrically connected to the radiation conductor (s) through wiring made of a printed circuit pattern.

Figure 6A:
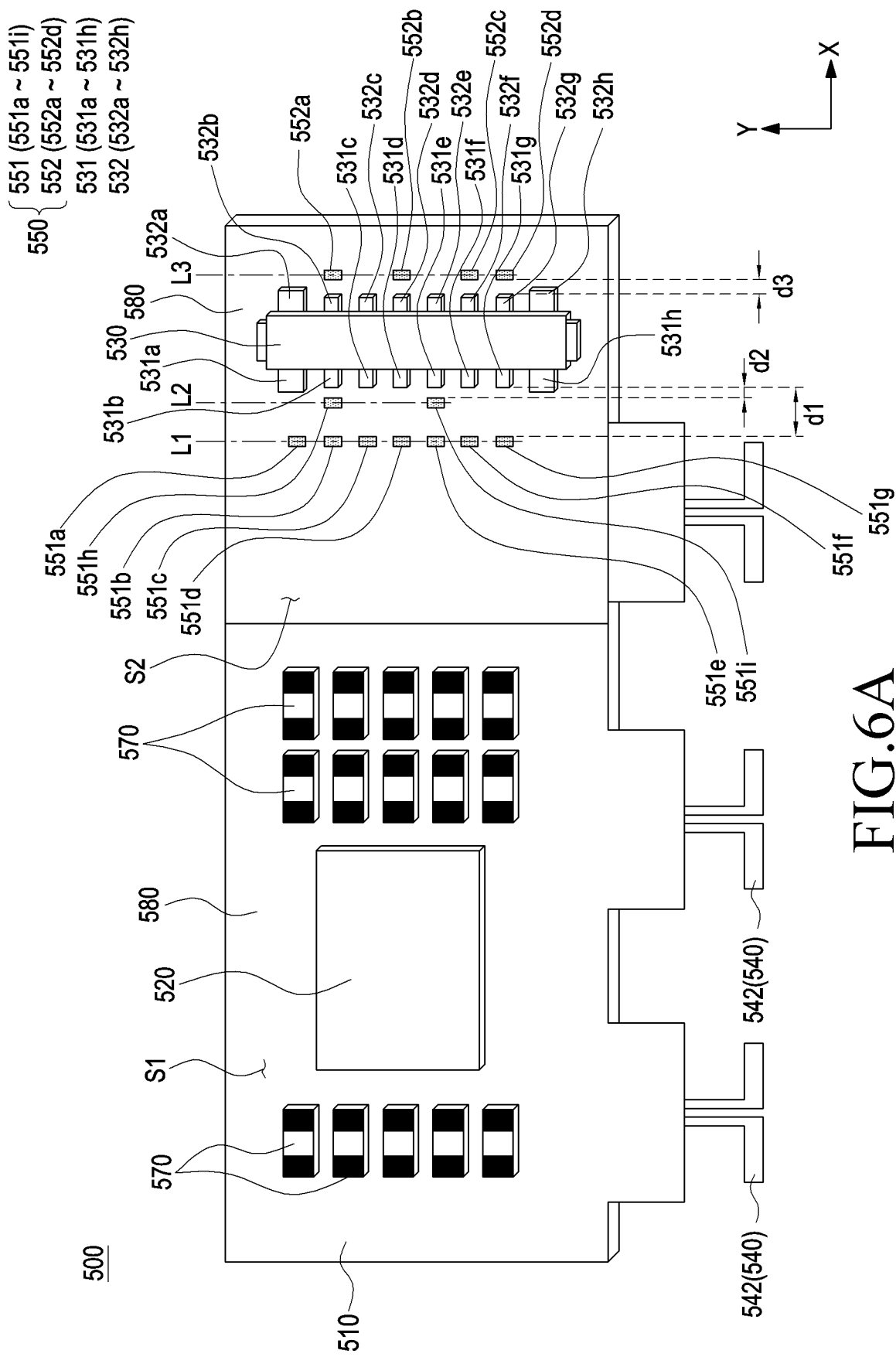
FIG. 6A is a diagram illustrating a face of an example board on which conductive pads are disposed according to various embodiments.
Figure 6B:
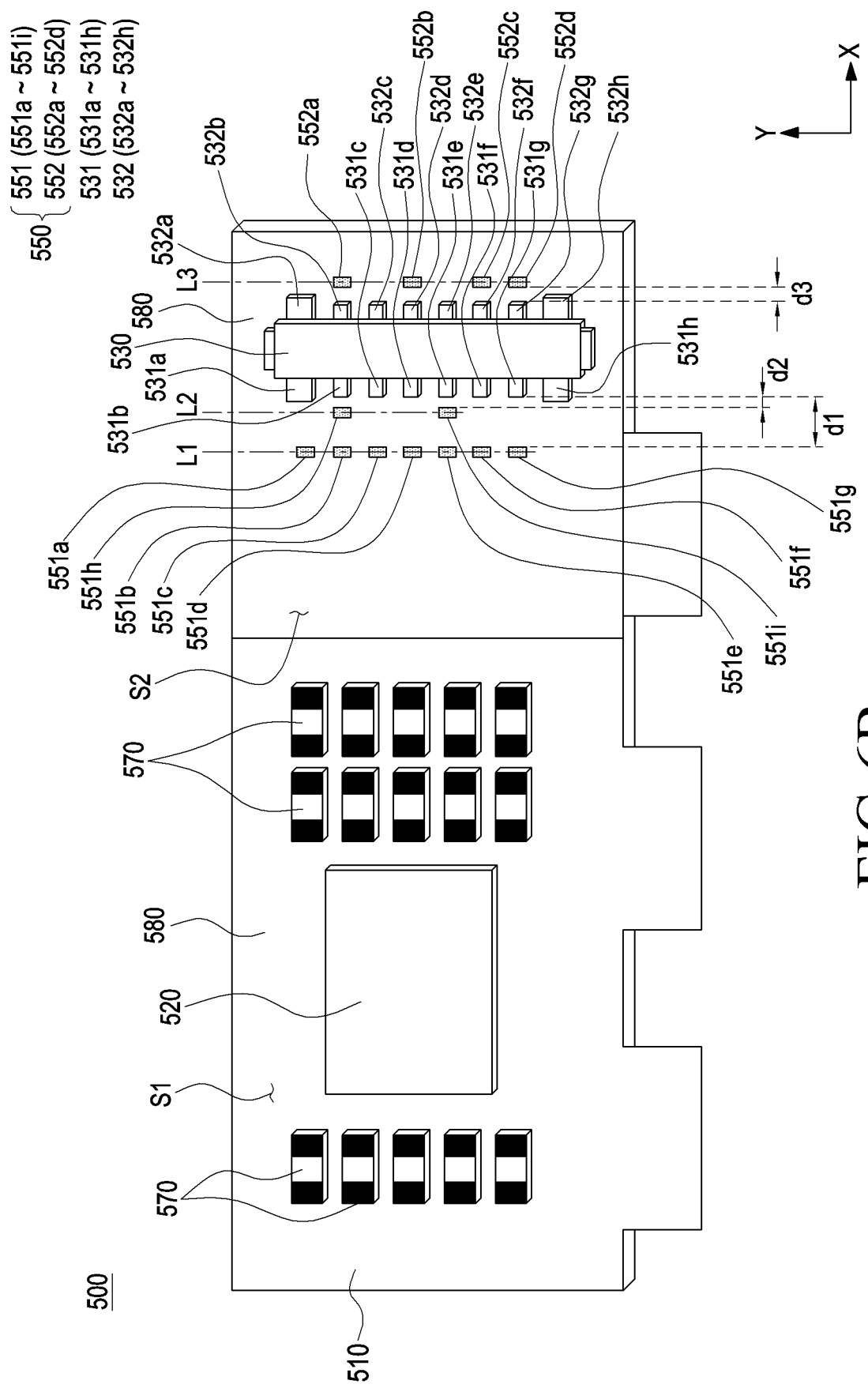
FIG. 6B is a diagram illustrating a face of an example board on which conductive pads are disposed according to various embodiments.
Figure 6C:
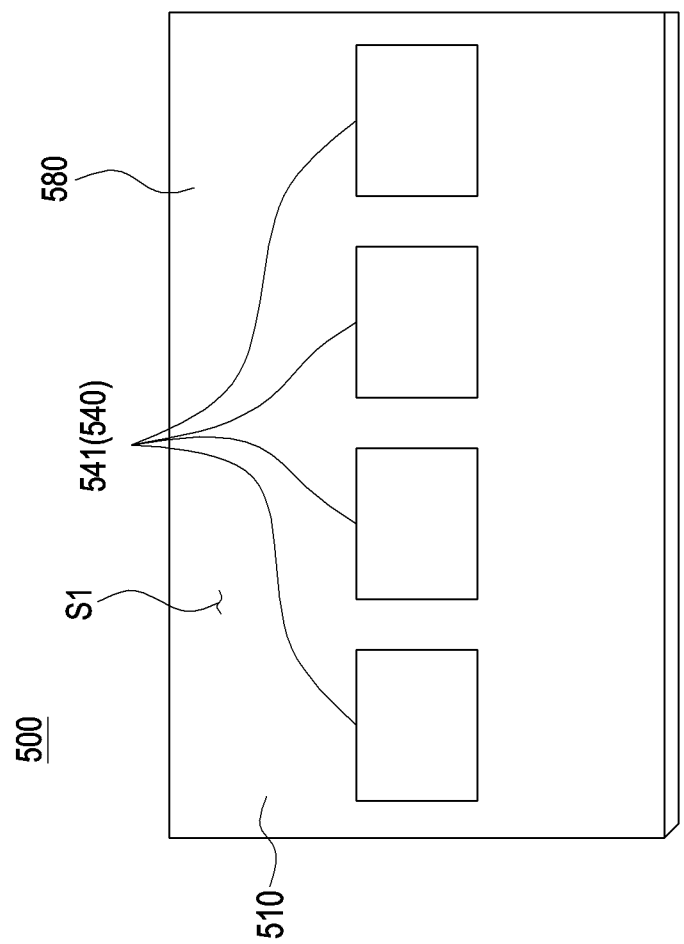
FIG. 6C is a diagram illustrating a face of an example board on which conductive pads are disposed according to various embodiments.

FIG. 6A is a diagram illustrating a face of an example board on which conductive pads are disposed according to various embodiments, and FIG. 6B is a diagram illustrating a face of an example board on which conductive pads are disposed according to various embodiments. FIG. 6C is a diagram illustrating an example structure of an antenna (e.g., a patch antenna) disposed on the rear face of a partial area S1 of the board of FIG. 6B.

According to various embodiments, the electronic device 300 (e.g., the electronic device 101 in FIGS. 1 to 5) may include an antenna module 500 (e.g., the third antenna module 246 in FIG. 2). The antenna module 500 may include a board 510 on which a circuit component, such as a communication circuit 520 (e.g., the first RFIC 222, the second RFIC 224, the third RFIC 226, or the fourth RFIC 228), is mounted. Referring to FIGS. 6A and 6B, the board 501 may include a first area S1 in which the communication circuit 520, an area of a ground member (e.g., ground) 580, and an antenna 540 are disposed, and a second area S2 which extends from the first area S1 and in which the remaining area of the ground member 580 and/or the connector 530 are disposed.

According to various embodiments, the communication circuit 520 may be disposed in the central portion of the first area S1 of the board 510, and multiple lumped elements 570 may be disposed in an area adjacent to the central portion. The communication circuit 520 and the multiple lumped elements 570 may be shielded by a shielding member (e.g., a shield can or a mold). A shielding cover pad (not illustrated) may be disposed at an edge area of the first area S1 to cover at least a portion of the communication circuit 520, thereby fixing the position of the shielding member. As another example, the shielding member may be bonded to the edge area of the first area S1 by molding or adhesion without a shielding cover pad. The antenna 540 may be disposed in an outer area of the shielding member of the first area S1.

According to various embodiments, the communication circuit 520 may support at least a part of a band from about 6 GHz to about 300 GHz (e.g., from about 24 GHz to about 30 GHz or from 37 GHz to 40 GHz). According to an embodiment, the communication circuit 520 may upconvert and/or downconvert a frequency. For example, the communication circuit 520 included in the electronic device 101 may receive a baseband signal via a conductive line and may directly upconvert the baseband signal into a radio frequency (RF) signal, and/or may receive an intermediate frequency (IF) signal through a conductive line and may upconvert or directly convert the IF signal into an RF signal. As another example, the electronic device 101 may receive a baseband signal through an antenna array (e.g., a dipole antenna 542 or a patch antenna 541) disposed on a face that is spaced apart from or faces away from the face on which the communication circuit 520 is disposed and may directly downconvert the baseband signal into an IF signal, and/or the electronic device 101 may downconvert or directly convert an RF signal (e.g., a mmWave signal) received through an antenna array into an IF signal and may transmit the IF signal to the communication circuit 520 using a conductive line.

According to various embodiments, the lumped elements 570 may be disposed on the board 510. The lumped elements 570 may be variously changed in design and may be located to be spaced apart from the communication circuit 520.

According to various embodiments, an antenna 540 may be disposed on one face of the board 510. The antenna 540 may include a dipole antenna 542 (e.g., the dipole antenna 542 in FIG. 6A) disposed in an end area of the board 510 and/or a patch antenna 541 (e.g., the patch antenna 541 in FIG. 6C) disposed on a face that is spaced apart from or faces away from the communication circuit 520.

The antenna 540 may include multiple radiation conductors. The multiple radiation conductors may include an array of multiple conductive plates. For example, each of the conductive plates may have a structure including a metal material, and may be provided as a radiator of an antenna. According to an embodiment, if the board 510 is implemented as a multilayer circuit board, patch-type or dipole-type conductive plates may be formed using some of the conductive layers (or wiring layers) inside the board 510. Although not illustrated, the board 510 formed as a multilayer circuit board structure may include conductive plates having a grid structure formed by a combination of via pads of each conductive layer and via holes formed in each insulating layer between adjacent conductive layers. The conductive plates having the grid structure may form another antenna array on a side face of the board 510 or inside the board 510 and adjacent to the side face. For example, various types of radiation conductors or antenna arrays may be formed on one face or the other face of the board 510 or inside the board 510.

According to various embodiments, in the second area S2 of the board 510, a ground member 580 extending from the first area S1, a connector 530, and conductive pads 550 including multiple pads may be disposed.

According to an embodiment, the connector 530 of the board 510 may include, for example, and without limitation, a coaxial cable connector, a board-to-board (B-to-B) connector, or the like, for electrically connecting the board 510 to another circuit board (e.g., a main circuit board (e.g., the printed circuit board 540 in FIG. 5) or a circuit board on which another communication circuit (e.g., an RFIC) is disposed) using a coaxial line (e.g., a coaxial cable or a flexible printed circuit board (FPCB)). The board 510 may be connected to another circuit board via a coaxial cable using, for example, a coaxial cable connector, and the coaxial cable may be used for delivering transmission and reception intermediate frequency (IF) signals or RF signals. As another example, an IF or RF signal, power, or other control signals may be transmitted through the B-to-B connector. According to an embodiment, the connector 530 may be spaced apart from the communication circuit 520 of the board 510 and may be disposed on the front, rear, or side face of the board 510.

According to an embodiment, the connector 530 may include multiple contacts (e.g., terminals) 531 or 532, and the multiple contacts 531 or 532 may be arranged in multiple parallel rows. A first row of the multiple contacts 531 or 532 of the connector 530 may include an IF1(RF1) (e.g., a vertical polarization pole) contact 531b and an IF2(RF2) (e.g., horizontal polarization pole) contact 531e disposed at the opposite sides of a ground interposed therebetween, and may include at least one power wiring contact 531g. For example, with reference to a $(1\text{-}1)^{th}$ ground 531a, an IF1 (RF1) 531b, a $(1\text{-}2)^{th}$ ground 531c, a $(1\text{-}3)^{th}$ ground 531d, an IF2 (RF2) 531e, a $(1\text{-}4)^{th}$ ground 531f, a $(1\text{-}1)^{th}$ power wiring contact 531g, and a $(1\text{-}5)^{th}$ ground 531h may be sequentially arranged in one direction (e.g., the Y-axis direction).

According to an embodiment, a second row of the multiple contacts 531 or 532 may include a data contact (e.g., a high-speed data contact) 532b and a second data contact 532d disposed at the opposite sides of the ground and connected to the second column of the plurality of contacts 531 or 532 via a ground, and may include one or more power wiring contacts 532f and 532g. For example, with reference to a $(2\text{-}1)^{th}$ ground 532a, a first data contact 532b, a $(2\text{-}2)^{th}$ ground 532c, a second data contact 532d, a $(2\text{-}3)^{th}$ ground 532e, a $(2\text{-}1)^{th}$ power wiring contact 532f, a $(2\text{-}3)^{th}$ power wiring contact 532g, and a $(2\text{-}4)^{th}$ ground 532h may be sequentially arranged in one direction (e.g., the Y-axis direction).

According to various embodiments, the board 510 may include conductive pads 550 including multiple pads spaced apart from the connector 530. The conductive pads 550 may be areas, which may be directly brought into contact with, for example, pogo pins of RF test equipment (e.g., RF measurement equipment 610 of FIG. 10), and may be ground areas for testing an RF signal flow. According to an embodiment, the conductive pads 550 including the multiple pads may be provided to correspond to the structure of the connector 530. For example, the conductive pads 550 including the multiple pads may include first-row pads 551 spaced apart from the contacts 531a to 531h arranged in a first row in the connector 530, and second-row pads 552 spaced apart from contacts 532a to 532e arranged in a second row in the connector 530. According to an embodiment, the first-row pads 551 may include second pads 551b and 551h, a third pad 551c, a fourth pad 551d, fifth pads 551e and 551i, a sixth pad 551f, and a seventh pad 551g in one direction (e.g., the Y-axis direction) with reference to a first pad 551a corresponding to the $(1\text{-}1)^{th}$ ground 531a among the contacts 531a to 531h of the first row. The second pads 551b and 551h may be spaced apart from each other to correspond to the IF1(RF1) 531b, and the fifth pads 551e and 551i may be spaced apart from each other to correspond to the IF2(RF2) 531e. The third pad 551c, the fourth pad 551d, and the sixth pad 551f may be disposed to be spaced apart from each other at positions corresponding to respective grounds (e.g., a $(1-2)^{th}$ ground 531c, a $(1-3)^{th}$ ground 531d, and a $(1-4)^{th}$ ground 531f) among the contacts 531a to 531h of the first row. The seventh pad 551g may be spaced apart from each other at a position corresponding to the $(1-1)^{th}$ power wiring contact 531g. At least some of the first-row pads 551 may be disposed to be parallel to the contacts 531b to 531g of the first row in the connector 530 along an imaginary first line L1, and may have a designated first separation distance d1. For example, the first separation distance d1 may be a distance between one end of the second pad 551 and one end of the IF1(RF1) 531b.

According to an embodiment, multiple second pads 551b and 551h may be provided. The second pads 551b and 551h are arranged to correspond to the IF1(RF1) 531b, and may include a $(2-1)^{th}$ pad 551b disposed at the designated first separation distance d1 from the IF1(RF1) 531b and a $(2-2)^{th}$ pad 551h disposed at a designated second separation distance d2 from the IF1(RF1) 531b. The first separation distance d1 and the second separation distance d2 may be adjusted to correspond to designated distances. For example, the first separation distance d1 may be the distance between one end of the $(2-1)^{th}$ pad 551b and one end of the IF1(RF1) 531b. The second separation distance d2 may be a distance between one end of the $(2-2)^{th}$ pad 551h and one end of the IF1(RF1) 531b.

According to an embodiment, multiple fifth pads 551e and 551i may be provided. The fifth pads 551e and 551i may be arranged to correspond to the IF2(RF2) 531e, and may include a $(5-1)^{th}$ pad 551e disposed at the designated first separation distance d1 from the IF2(RF2) 531e and a $(5-2)^{th}$ pad 551i disposed at the designated second separation distance d2 from the IF2(RF2) 531e. The first separation distance d1 and the second separation distance d2 may be adjusted to correspond to designated distances. The center of the $(2-1)^{th}$ pad 551b and the center of the $(5-1)^{th}$ pad 551e may be arranged on the same line along the imaginary first line L1. The center of the $(2-2)^{th}$ pad 551h and the center of the $(5-2)^{th}$ pad may be arranged on the same line along the imaginary second line L2.

According to an embodiment, the second-row pads 552 may include a ninth pad 552b, a tenth pad 552c, and an eleventh pad 552b in one direction with reference to an eighth pad 552a corresponding to the first data contact 532b among the contacts 532a to 532h of the second row. The eighth pad 552a may be spaced apart from each other at a position corresponding to the first data contact 532b, and the ninth pad 552b may be spaced to correspond to the second data contact 532d. The tenth pad 552c and the eleventh pad 552d may be disposed to be spaced apart from each other at positions corresponding to the $(2-1)^{th}$ power wiring contact 532f and the $(2-2)^{th}$ power wiring contact 532g among the contacts 532a to 532h of the second row. The array of the pads 552a to 552d of the second row may be arranged to be parallel to the contacts 531b to 531g of the second row in the connector 530 along an imaginary third line L3, and may have a designated third separation distance d3. For example, the third separation distance d3 may be the distance between one end of the eighth pad 551 and one end of the first data contact 532b.

According to an embodiment, the pads are ground areas, which are brought into contact with pogo pins of the RF measurement equipment 610, and are exposed to the outer face of the board 510, thereby making grounding simple and implementing efficient signal measurement without damaging the connector.

Figure 7:
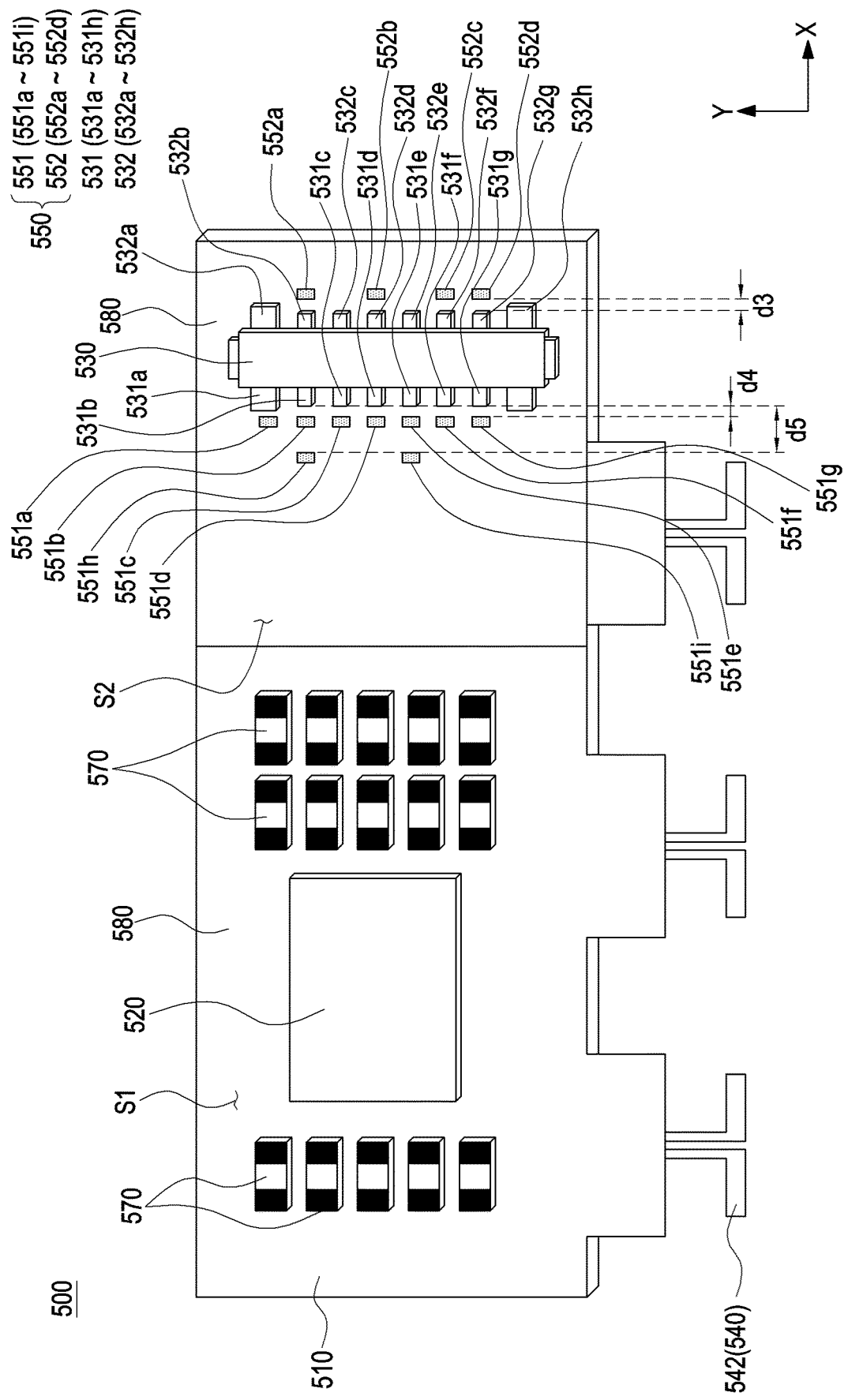
FIG. 7 is a diagram illustrating a face of an example board on which conductive pads are disposed according to another embodiment.

FIG. 7 is a diagram illustrating a face of an example board on which conductive pads are disposed according to another embodiment.

According to various embodiments, an electronic device (e.g., the electronic device 101 in FIGS. 1 to 5) may include a board 510, on which a circuit component such as a communication component 520 (e.g., the first RFIC 222, the second RFIC 224, the third RFIC 226, or the fourth RFIC 228 in FIG. 2) is mounted.

Referring to FIG. 7, the board 510 may include a first area S1 and a second area S2 extending from the first area S1. The communication circuit 520 may be disposed in the central portion of the first area S1 of the board 510, and multiple lumped elements 570 may be disposed in an area adjacent to the central portion. The communication circuit 520 and the multiple lumped elements 570 may be shielded by a shielding member (e.g., a shield can). The antenna 540 may be disposed in an outer area of the shielding member of the first area S1. The structures of the communication circuit 520, the lumped elements 570, an area of a ground member 580, and an antenna 540, which are disposed in the first area S1 in FIG. 7, may be the same as or similar to the structures of the communication circuit 520, the lumped elements 570, an area of the ground member 580, and the antenna 540, which are disposed in the first area S1 of the board 510 in FIGS. 6A to 6C. For example, the antenna 540 may include a dipole antenna 542 disposed in an end area of the board 510 and/or a patch antenna 541 (e.g., the patch antenna 541 in FIG. 6C) disposed on a face that faces away from the communication circuit 520. According to various embodiments, in the second area S2 of the board 510, another area of the ground member 580, a connector 530, and conductive pads 550 may be disposed. The structures of the connector 530 and the conductive pads 550 disposed in the second area S2 of the board 510 may the same as or similar to the structures of the connector 530 and the conductive pads 550 in FIGS. 6A and 6B. Hereinafter, differences therefrom are described.

According to an embodiment, the connector 530 may include multiple contacts (terminals) 531 or 532, and multiple contacts 531 or 532 may be arranged in multiple parallel rows. For example, a first row, in which an IF1(RF1) 531b and IF2(RF2) 531e are arranged on opposite sides of a ground, and a second row, in which a first data contact 532b and a second data contact 532d are arranged on opposite sides of a ground may be included.

According to various embodiments, the board 510 may include conductive pads 550 including multiple pads spaced apart from the connector 530. The conductive pads 550 may be areas, which are to be directly brought into contact with probes (e.g., pogo pins) of an RF test equipment, and may be ground areas for testing an RF signal flow. According to an embodiment, the conductive pads 550 may be provided to correspond to the structure of the connector 530. For example, the conductive pads 550 may include first-row pads 551 spaced apart from the contacts 531a to 531h arranged in a first row in the connector 530, and second-row pads 552 spaced apart from contacts 532a to 532e arranged in a second row in the connector 530.

According to an embodiment, the first-row pads 551 may include second pads 551b and 551h, a third pad 551c, a fourth pad 551d, fifth pads 551e and 551i, a sixth pad 551f, and a seventh pad 551g in one direction (e.g., the Y-axis direction) with reference to a first pad 551a corresponding to the (1-1)$^{th}$ ground 531g among the contacts 531a to 531h of the first row. The second pads 551b and 551h may be spaced apart from each other to correspond to the IF1(RF1) 531b, and the fifth pads 551e and 551i may be spaced apart from each other to correspond to the IF2(RF2) 531e.

According to an embodiment, multiple second pads 551b and 551h may be provided. The second pads 551b and 551h are arranged to correspond to the IF1(RF1) 531b, and may include a (2-1)$^{th}$ pad 551b disposed at the designated fourth separation distance d4 from the IF1(RF1) 531b and a (2-2)$^{th}$ pad 551h disposed at a designated fifth separation distance d5 from the IF1(RF1) 531b. The fifth separation distance d5 may be larger than the fourth separation distance d4.

According to an embodiment, multiple fifth pads 551e and 551i may be provided. The fifth pads 551e and 551i are arranged to correspond to the IF2(RF2) 531e, and may include a (5-1)$^{th}$ pad 551e disposed at the designated fourth separation distance d4 from the IF2(RF2) 531e and a (5-2)$^{th}$ pad 551i disposed at the designated fifth separation distance d5 from the IF2(RF2) 531e. The fifth separation distance d5 may be larger than the fourth separation distance d4. The center of the (2-1)$^{th}$ pad 551b and the center of the (5-1)$^{th}$ pad 551e may be arranged on the same line along the imaginary line. The center of the (2-2)$^{th}$ pad 551h and the center of the (5-2)$^{th}$ pad 551i may be arranged on the same line along the imaginary line.

According to the disclosure, the conductive pads are ground areas, which are brought into contact with pogo pins of the RF measurement equipment, and are exposed to the outer face of the board 510, thereby making grounding simple and implementing efficient signal measurement without damaging the connector.

Figure 8A:
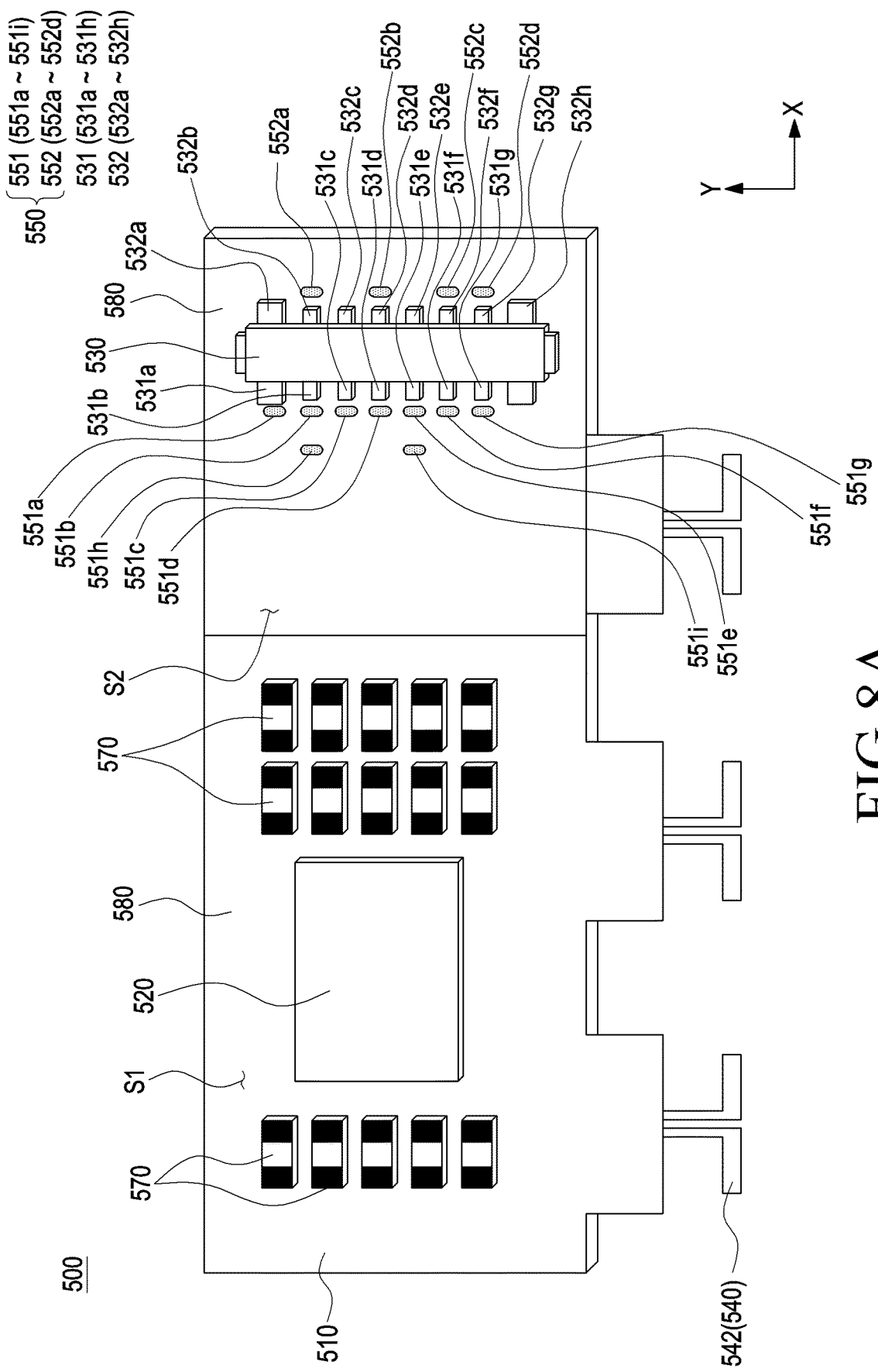
FIG. 8A is a diagram illustrating a face of an example board on which conductive pads are disposed according to another embodiment.
Figure 8B:
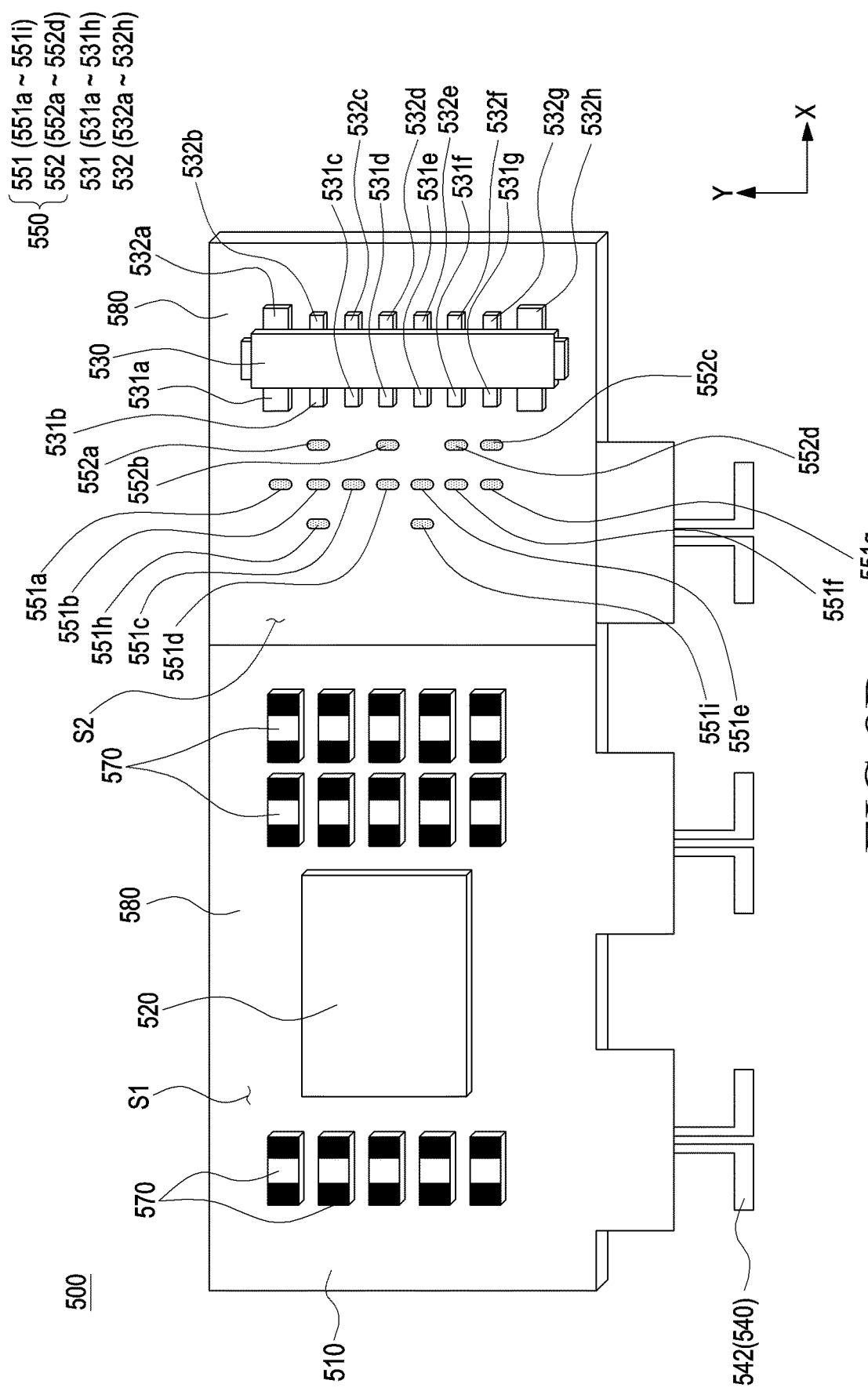
FIG. 8B is a diagram illustrating a face of an example board on which conductive pads are disposed according to another embodiment.

FIG. 8A is a diagram illustrating a face of an example board on which conductive pads are disposed according to another embodiment, and FIG. 8B is a diagram illustrating a face of a board on which conductive pads are disposed according to another embodiment.

According to various embodiments, an electronic device (e.g., the electronic device 101 in FIGS. 1 to 5) may include a board 510, on which a circuit component such as a communication circuit 520 (e.g., the first RFIC 222, the second RFIC 224, the third RFIC 226, or the fourth RFIC 228 in FIG. 2) is mounted.

Referring to FIGS. 8A and 8B, the board 510 may include a first area S1 and a second area S2 extending from the first area S1. The communication circuit 520 may be disposed in the central portion of the first area S1 of the board 510, and multiple lumped elements 570 may be disposed in an area adjacent to the central portion. The communication circuit 520 and the multiple lumped elements 570 may be shielded by a shielding member (e.g., a shield can). The antenna 540 may be disposed in an outer area of the shielding member of the first area S1. The structures of the communication circuit 520, the lumped elements 570, an area of a ground, and an antenna 540, which are disposed in the first area S1 in FIGS. 8A and 8B, may be the same as or similar to the structures of the communication circuit 520, the lumped elements 570, an area of a ground 580, and an antenna 540, which are disposed in the first area S1 in FIG. 7. For example, the antenna 540 may include a dipole antenna 542 disposed in an end area of the board 510 and/or a patch antenna 541 (e.g., the patch antenna 541 in FIG. 6C) disposed on a face that faces away from the communication circuit 520.

According to various embodiments, in the second area S2 of the board 510, the ground member 580, a connector 530, and other areas conductive pads 550 may be disposed. The structures of the connector 530 and the conductive pads 550 disposed in the second area S2 of the board 510 may the same as or similar to the structures of the connector 530 and the other areas of the conductive pads 550 in FIG. 7. Hereinafter, differences therefrom are described.

According to various embodiments, the connector 530 may include multiple contacts (terminals), and the multiple contacts 531 may be arranged in multiple parallel rows. For example, a first row, in which an IF1(RF1) 531b and IF2(RF2) 531e are arranged on opposite sides of a ground, and a second row, in which a first data contact 532b and a second data contact 532d are arranged on opposite sides of a ground may be included.

According to various embodiments, the board 510 may include conductive pads 550 including multiple pads spaced apart from the connector 530. The conductive pads 550 may be formed in various shapes. For example, as illustrated in FIGS. 6 and 7, the conductive pads 550 may be manufactured in rectangular plate shapes. As another example, as illustrated in FIG. 8A, the conductive pads 550 may be manufactured in rounded-rectangular plate shapes. However, the conductive pads 550 are not limited thereto, and the design thereof may be changed into various shapes for convenient contact as areas that are brought into direct contact with the pogo pins of RF test equipment.

According to various embodiments, the conductive pads 550 may be provided on opposite sides or one side of the connector 530. For example, as illustrated in FIG. 8A, the conductive pads 550 may be arranged in designated arrays on opposite sides of the connector 530. As another example, as illustrated in FIG. 8B, the conductive pads 550 may be arranged in a designated array on one side of the connector 530, for example, between the connector 530 and the communication circuit 520. As another example, the conductive pads 550 may be disposed to correspond to the contacts of the connector 530 in one-to-one correspondence with the contacts of the connector 530, or to correspond to some contacts of the connector 530.

Figure 9:
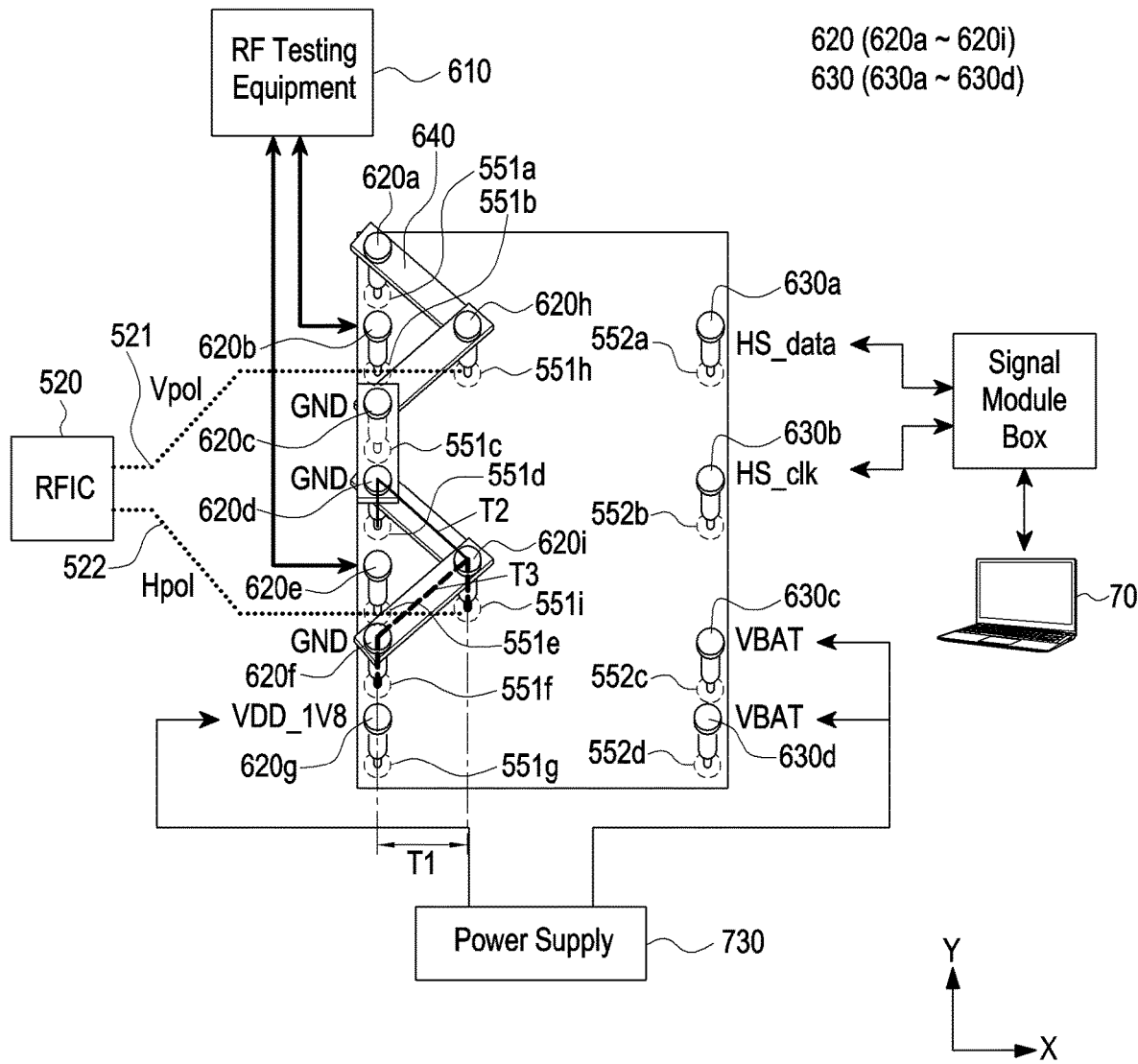
FIG. 9 is a diagram illustrating an example area in which conductive pads connected to RF measurement equipment are arranged according to various embodiments.

FIG. 9 is a diagram illustrating an example area in which conductive pads connected to RF measurement equipment are arranged according to various embodiments.

According to various embodiments, conductive pads 550 including multiple pads may be formed in the second region S2 of the board 510 to be connected to RF measurement equipment 610. The conductive pads 550 may include first-row pads 551 and second-row pads 552 on opposite sides of the connector 530. Some or all of the structures of the first-row pads 551 and the second-row pads 552 of the conductive pads 550 in FIG. 9 are the same as those of the first-row pads 551 and the second-row pads 552 of the conductive pads 550 in FIG. 6.

According to various embodiments, the communication circuit 520 disposed in an area (e.g., the first area S1 in FIG. 6) of the board (e.g., the board 510 in FIG. 6) may be electrically connected to the connector (e.g., the connector 530 of FIG. 6) and conductive pads 551 or 552 through a conductive line. According to an embodiment, the first-row pads 551 may include second pads 551b and 551h, a third pad 551c, a fourth pad 551d, fifth pads 551e and 551i, a sixth pad 551f, and a seventh pad 551g in a first direction (e.g., the Y-axis direction) with reference to a first pad 551a corresponding to the ground among the contacts of the first row. The second pads 551b and 551h may be spaced apart from each other to correspond to the IF1(RF1) 531b, and may be electrically connected to the first conductive line 521 of the communication circuit 520. The fifth pads 551e and 551i may be spaced apart from each other to correspond to the IF2(RF2) 531e, and may be electrically connected to the second conductive line 522 of the communication circuit 520.

According to an embodiment, the second pads 551b and 551h may include a (2-1)$^{th}$ pad 551b and a (2-2)$^{th}$ pad 551h which are spaced apart from each other in a second direction (e.g., the X-axis direction) perpendicular to the first direction (e.g., the Y-axis direction). As another example, the fifth pads 551e and 551i may include a (5-1)$^{th}$ pad 551e and a (5-2)$^{th}$ pad 551i which are spaced apart from each other in a second direction (e.g., the X-axis direction) perpendicular to the first direction (e.g., the Y-axis direction). The (2-1)$^{th}$ pad 551b and the (5-1)$^{th}$ pad 551e may be arranged on the same line as other pads (e.g., the first pad 551a, the third pad 551c, the fourth pad 551d, the sixth pad 551f, and the seventh pad 551g), and the (2-2)$^{th}$ pad 551h and the (5-2)$^{th}$ pad 551i may not be arranged on the same line as the other pads (e.g., the first pad 551a, the third pad 551c, the fourth pad 551d, the sixth pad 551f, and the seventh pad 551g).

According to various embodiments, the RF measurement equipment 610 includes multiple pogo pins 620 and 630, and the multiple pogo pins 620 and 630 may be brought into contact with the conductive pads 550 including the multiple pads, respectively, so as to measure an RF signal flow. The number of provided multiple pogo pins 620 and 630 that come into contact with the conductive pads 550 may correspond to the number of the conductive pads 550, respectively, and the multiple pogo pins may include a first pogo pin 620a that comes into contact with the first pad 551a, second pogo pins 620b and 620h that come into contact with the second pads 551b and 551h, a third pogo pin 620c that comes into contact with the third pad 551c, a fourth pogo pin 620d that comes into contact with the fourth pad 551d, fifth pogo pins 620e and 620i that come into contact with the fifth pads 551e and 551i, a sixth pogo pin 620f that comes into contact with the sixth pad 551f, and a seventh pogo pin 620g that comes into contact with the seventh pad 551g. The second pogo pins 620b and 620h may include a (2-1)$^{th}$ pogo pin 620b that comes into contact with the (2-1)$^{th}$ pad 551b and a (2-2)$^{th}$ pogo pin 620h that comes into contact with the (2-2)$^{th}$ pad 551h. The fifth pogo pins 620e and 620i may include a (5-1)$^{th}$ pogo pin 620e that comes into contact with the (5-1)$^{th}$ pad 551e and a (5-2)$^{th}$ pogo pin 620i that comes into contact with the (5-2)$^{th}$ pad 551i.

According to an embodiment, some of the pogo pins 620 and 630 of the RF measurement equipment 610 are directly connected to the RF measurement equipment 610 to provide an electrical flow during contact with the conductive pads 551a to 551i. For example, the (2-1)$^{th}$ pogo pin 620b of the pogo pins 620 and 630 may come into contact with the (2-1)$^{th}$ pad 551b connected to the vertical polarization pole. The (5-1)$^{th}$ pogo pin 620e may come into contact with the (5-1)$^{th}$ pad 551e connected to the horizontal polarization pole.

According to an embodiment, the pogo pins 620 and 630 of the RF measurement equipment 610 may be arranged to contact the pads 550, respectively, and conductive members 640 forming a conductive line may be disposed between the pogo pins 620 and 630. Each of the conductive members 640 may have a plate shape and may be electrically connected to a corresponding pogo pin. For example, through the conductive members 640, the first pogo pin 620a, the (2-2)$^{th}$ pogo pin 620h, the third pogo pin 620c, the fourth pogo pin 620d, the (5-2)$^{th}$ pogo pin 620i, and the sixth pogo pin 620f may be electrically connected to each other. As another example, each of the conductive members 640 connecting the multiple pogo pins may have a "W" shape.

According to various embodiments, the distance between the pads and the distance between the pogo pins, which are in contact with the pads, may be adjusted in order to accurately measure an RF signal of the conductive pads 550 including multiple pads connected to the RF measurement equipment 610.

According to an embodiment, the distance between the (5-1)$^{th}$ pad 551e and the (5-2)$^{th}$ pad 551i of the fifth pads 551e and 551i may be formed to have a first designated distance T1. The first designated distance T1 may be (1+2n)$\lambda$/4, wherein n may be an integer that is not smaller than 0.

According to an embodiment, it is possible to adjust the distance between the (5-2)$^{th}$ pad 551i and the ground adjacent thereto. In consideration of the connection state of the RF measurement equipment 610 with the pogo pins, the sum of i) the distance between the (5-2)$^{th}$ pad 551i and the fourth pad 551d connected to the adjacent ground (the distance between the (5-2)$^{th}$ pogo pin 620i and the fourth pogo pin 620d), ii) the length of the (5-2)$^{th}$ pogo pin 620i that comes into contact with the (5-2)$^{th}$ pad 551i, and iii) the length of the fourth pogo pin 620d that comes into contact with the fourth pad 551d may be formed to have the second designated distance T2. The second designated distance T2 may be n$\lambda$/2, wherein n may be an integer that is not smaller than 1. As another example, the sum of i) the distance between the (5-2)$^{th}$ pad 551i and the sixth pad 551f connected to the adjacent ground (the distance between the (5-2)$^{th}$ pogo pin 620i and the sixth pogo pin 620f), ii) the length of the (5-2)$^{th}$ pogo pin 620i that comes into contact with the (5-2)$^{th}$ pad 551i, and iii) the length of the sixth pogo pin 620f that comes into contact with the sixth pad 551f may be formed to have the third designated distance T3. The third designated distance T3 may be n$\lambda$/2, wherein n may be an integer that is not smaller than 1.

According to an embodiment, by designating the distance from the (5-1)$^{th}$ pad 551e to the (5-2)$^{th}$ pad 551i as the first designated distance T1, and designating the sum of the length connected from the (5-2)$^{th}$ pad 551i to the adjacent ground and the lengths of two pogo pins as the second designated distance T2 and the third designated distance T3, respectively, the impedance transferred from the (5-1)$^{th}$ pad 551e to the (5-2)$^{th}$ pad 551i becomes infinite, and thus it is possible to perform lossless measurement.

$$Z_{in} = Z_0 \left( \frac{Z_L + j \cdot Z_0 \cdot \tan\frac{2\pi\lambda}{\lambda 4}}{Z_0 + j \cdot Z_L \cdot \tan\frac{2\pi\lambda}{\lambda 4}} \right) = \frac{Z_0^2}{Z_L} = \frac{Z_0^2}{0} = \infty \qquad \text{Equation 1}$$

$Z_{in}$ may represent the input impedance of a transmission line, $Z_o$ may represent the characteristic impedance of the transmission line, $Z_L$ may represent the load impedance of the transmission line, and L may represent the length of the transmission line.

Referring to Equation 1, in the state in which the (5-1)$^{th}$ pogo pin 620e is grounded to the (5-1)$^{th}$ pad 551e, the (5-2)$^{th}$ pogo pin 620i is grounded to the (5-2)$^{th}$ pad, the fourth pogo pin 620d is grounded to the fourth pad, and the sixth pogo pin 620f is grounded to the sixth pad 551f, it can be seen that the impedance transferred from the (5-1)$^{th}$ pad 551e to the (5-2)$^{th}$ pad 551i becomes infinite. Thereby, it is possible to provide a lossless measurement amount of a signal transmitted from the connector.

According to an embodiment, the distance between the (2-1)$^{th}$ pad 551b and the (2-2)$^{th}$ pad 551h of the second pads 551b and 551h may be formed to have a first designated distance T1. The first designated distance T1 may be (1+2n)λ/4, wherein n may be an integer that is not smaller than 0.

According to an embodiment, it is possible to adjust the distance between the $(2\text{-}2)^{th}$ pad 551h and the ground adjacent thereto. In consideration of the connection state of the RF measurement equipment 610 with the pogo pins, the sum of the distance between the $(2\text{-}2)^{th}$ pad 551h and the first pad 551a connected to the adjacent ground, the length of the $(2\text{-}2)^{th}$ pogo pin 620h that comes into contact with the $(2\text{-}2)^{th}$ pad 551h, and the length of the first pogo pin 620a that comes into contact with the first pad 551a may be formed to have the second designated distance T2. The second designated distance T2 may be nλ/2, wherein n may be an integer that is not smaller than 1. As another example, the sum of the distance between the $(2\text{-}2)^{th}$ pad 551h and the third pad 551c connected to the adjacent ground, the length of the $(2\text{-}2)^{th}$ pogo pin 620h that comes into contact with the $(2\text{-}2)^{th}$ pad 551h, and the length of the third pogo pin 620c that comes into contact with the third pad 551c may be formed to have the third designated distance T3. The third designated distance T3 may be nλ/2, wherein n may be an integer that is not smaller than 1.

According to an embodiment, by designating the distance from the $(2\text{-}1)^{th}$ pad 551b to the $(2\text{-}2)^{th}$ pad 551h as the first designated distance T1, and designating the sum of the length connected from the $(2\text{-}2)^{th}$ pad 551h to the adjacent ground and the lengths of two pogo pins as the second designated distance T2 and the third designated distance T3, respectively, the impedance transferred from the $(2\text{-}1)^{th}$ pad 551b to the $(2\text{-}2)^{th}$ pad 551h becomes infinite, and it is possible to perform lossless measurement.

According to various embodiments, the second-row pads 552 may include a ninth pad 552b, a tenth pad 552c, and an eleventh pad 552b in one direction with reference to an eighth pad 552a corresponding to the first data contact 532b among the contacts 532a to 532e of the second row. The eighth pad 552a may be spaced apart from and electrically connected to the first data contact 532b of the connector 530, and the ninth pad 552b may be spaced apart from and electrically connected to the second data contact 532d. In order to monitor and control a signal through an external electronic device 70, each of the eighth pad 552a and the ninth pad 552b may be electrically connected to a signal module box 710, which includes a pogo pin.

According to various embodiments, the seventh pad 551g, the tenth pad 552c, and the eleventh pad 552d connected to the power supply wiring contacts of the connector may be connected to a power supply 730 (e.g., the power management module 188 in FIG. 1). The power supply may include multiple pogo pins, and each pogo pin may come into contact with the seventh pad 551g, the tenth pad 552c, and the eleventh pad 552d.

Figure 10:
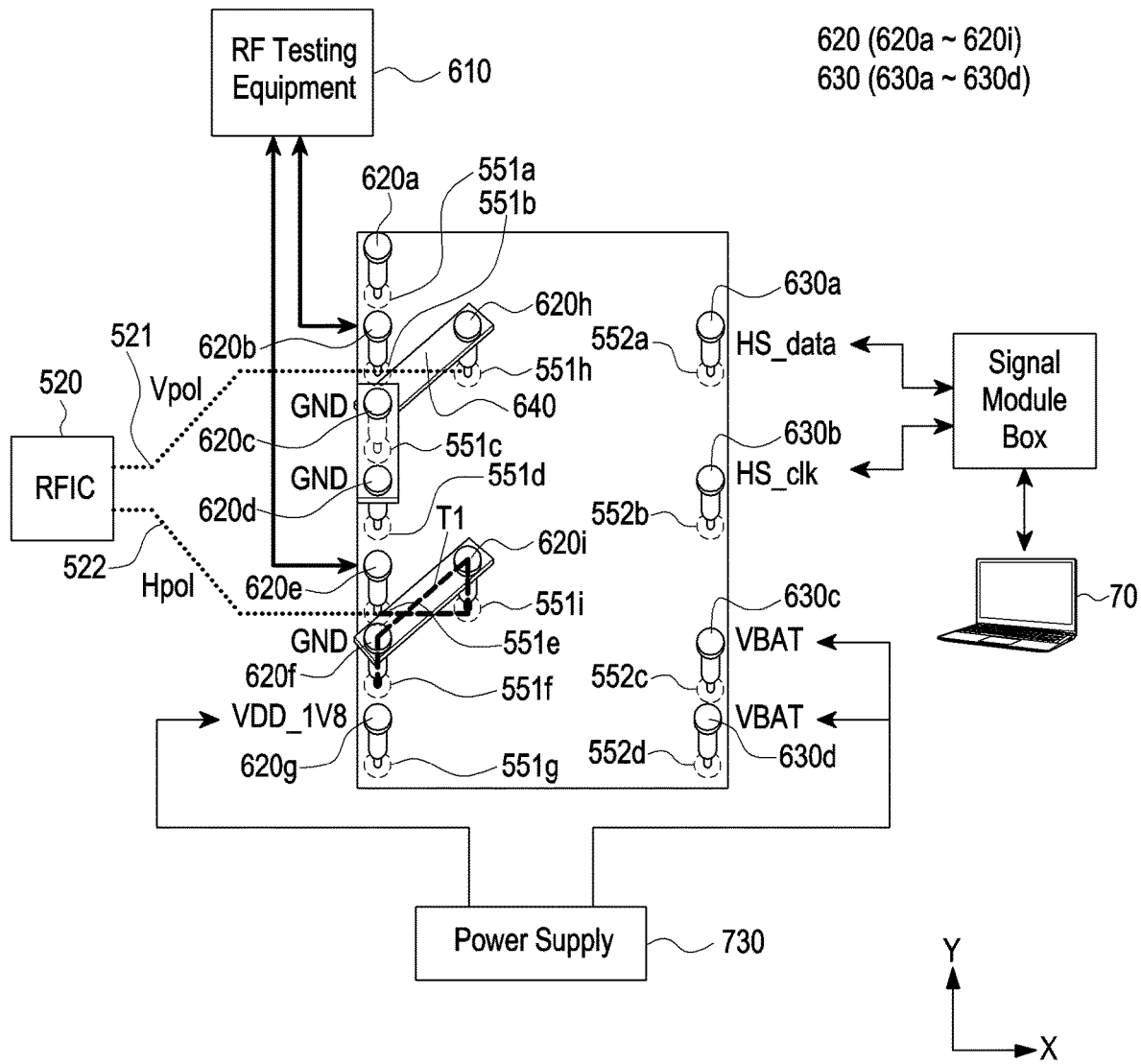
FIG. 10 is a diagram illustrating an example area in which conductive pads connected to RF measurement equipment are arranged according to another embodiment of the disclosure.

FIG. 10 is a diagram illustrating an example area, in which conductive pads connected to RF measurement equipment are arranged according to another embodiment of the disclosure.

According to various embodiments, conductive pads 550 including multiple pads may be formed in the second region S2 of the board 510 to be connected to RF measurement equipment 610. The conductive pads 550 may include first-row pads 551 and second-row pads 552 on opposite sides of the connector 530. Some or all of the structures of the first-row pads 551 and the second-row pads 552 of the conductive pads 550 in FIG. 10 are the same as those of the first-row pads 551 and the second-row pads 552 of the conductive pads 550 in FIG. 6.

According to various embodiments, the communication circuit 520 disposed in an area (e.g., the first area S1) of the board 510 may be electrically connected to the connector 530 and conductive pads 551a to 551i through a conductive line. According to an embodiment, the first-row pads 551 may include second pads 551b and 551h, a third pad 551c, a fourth pad 551d, fifth pads 551e and 551i, a sixth pad 551f, and a seventh pad 551g disposed in a first direction (e.g., the Y-axis direction) with reference to a first pad 551a corresponding to the ground among the contacts 531a to 531h of the first row. The second pads 551b and 551h may be spaced apart from each other to correspond to the IF1(RF1) 531b, and may be electrically connected to the first conductive line 521 of the communication circuit 520. The fifth pads 551e and 551i may be spaced apart from each other to correspond to the IF2(RF2) 531e, and may be electrically connected to the second conductive line 522 of the communication circuit 520.

Since the configuration of the conductive patterns 550 in FIG. 10 may be the same as or similar to the configuration of the conductive patterns 550 in FIG. 9, differences therefrom will be mainly described.

According to an embodiment, the second pads 551b and 551h may include a $(2\text{-}1)^{th}$ pad 551b and a $(2\text{-}2)^{th}$ pad 551h which are spaced apart from each other in a second direction (e.g., the X-axis direction) perpendicular to the first direction (e.g., the Y-axis direction). As another example, the fifth pads 551e and 551i may include a $(5\text{-}1)^{th}$ pad 551e and a $(5\text{-}2)^{th}$ pad 551i which are spaced apart from each other in a second direction (e.g., the X-axis direction) perpendicular to the first direction (e.g., the Y-axis direction). The $(2\text{-}1)^{th}$ pad 551b and the $(5\text{-}1)^{th}$ pad 551e may be arranged on the same line as other pads (e.g., the first pad 551a, the third pad 551c, the fourth pad 551d, the sixth pad 551f, and the seventh pad 551g), and the $(2\text{-}2)^{th}$ pad 551h and the $(5\text{-}2)^{th}$ pad 551i may not be arranged on the same line as the other pads.

According to various embodiments, the RF measurement equipment 610 includes multiple pogo pins 620 and 630, and the multiple pogo pins 620 and 630 may be brought into contact with the conductive pads, respectively, so as to measure an RF signal flow. The number of provided multiple pogo pins 620 and 630 may correspond to the number of the conductive pads that come into contact with the conductive pads 550, respectively, and the multiple pogo pins may include a first pogo pin 620a that comes into contact with the first pad 551a, second pogo pins 620b and 620h that come into contact with the second pads 551b and 551h, a third pogo pin 620c that comes into contact with the third pad 551c, a fourth pogo pin 620d that comes into contact with the fourth pad 551d, fifth pogo pins 620e and 620i that come into contact with the fifth pads 551e and 551i, a sixth pogo pin 620f that comes into contact with the sixth pad 551f, and a seventh pogo pin 620g that comes into contact with the seventh pad 551g. The second pogo pins 620b and 620h may include a $(2\text{-}1)^{th}$ pogo pin 620b that comes into contact with the $(2\text{-}1)^{th}$ pad 551b and a $(2\text{-}2)^{th}$ pogo pin 620h that comes into contact with the $(2\text{-}2)^{th}$ pad 551h. The fifth pogo pins 620e and 620i may include a $(5\text{-}1)^{th}$ pogo pin 620e that comes into contact with the $(5\text{-}1)^{th}$ pad 551e and a $(5\text{-}2)^{th}$ pogo pin 620i that comes into contact with the $(5\text{-}2)^{th}$ pad 551i.

According to an embodiment, some of the pogo pins 620 and 630 of the RF measurement equipment 610 are directly connected to the RF measurement equipment 610 to provide an electrical flow during contact with the conductive pads. The $(2\text{-}1)^{th}$ pogo pin 620b of the pogo pins 620 and 630 may come into contact with the (2-1)$^{th}$ pad 551*b* connected to the vertical polarization pole. The (5-1)$^{th}$ pogo pin 620*e* may come into contact with the (5-1)$^{th}$ pad 551*e* connected to the horizontal polarization pole.

According to an embodiment, the pogo pins 620 and 630 of the RF measurement equipment 610 may be arranged to contact the pads, respectively, and conductive members 640 forming a conductive line may be disposed between the pogo pins 620 and 630. Each of the conductive members 640 may have a plate shape and may be electrically connected to a corresponding pogo pin. For example, the conductive members 640 may include a first conductive member 640 and a second conductive member 640, which are spaced apart from each other, and the (2-2)$^{th}$ pogo pin 620*a* is connected, through the first conductive member 640, to the third pogo pin 620*c* and the fourth pogo pin 620*d*. As another example, the (5-2)$^{th}$ pogo pin 620*i* and the sixth pogo pin 620*f* may be disposed to be connected through the second conductive member 640.

According to various embodiments, the distance between the pads and the distance between the pogo pins, which are in contact with the pads, may be adjusted in order to accurately measure an RF signal of the conductive pads 550 including multiple pads connected to the RF measurement equipment 610.

According to an embodiment, it is possible to adjust the distance between the (5-2)$^{th}$ pad 551*i* and the ground adjacent thereto. In consideration of the connection state of the RF measurement equipment 610 with the pogo pins, the sum of i) the distance between the (5-1)$^{th}$ pad 551*e* and the (5-2)$^{th}$ pad 551*i*, ii) the distance between the (5-2)$^{th}$ pogo pin 551*i* and the sixth pad 551*f* connected to the adjacent ground (the distance between the (5-2)$^{th}$ pogo pin 620*i* and the sixth pogo pin 620*f*), iii) the length of the (5-2)$^{th}$ pogo pin 620*i* that comes into contact with the (5-2)$^{th}$ pad 551*i*, and iv) the length of the sixth pogo pin 620*f* that comes into contact with the sixth pad 551*f* may be formed to have the first designated distance T1. The first designated distance T1 may be $(1+2n)\lambda/4$, wherein n may be an integer that is not smaller than 0.

According to an embodiment, when the distance from the (5-1)$^{th}$ pad 551*e* to the second conductive member, the sixth pogo pin 620*f*, and the sixth pad 551*f* via the (5-2)$^{th}$ pad 551*i* and the (5-2)$^{th}$ pogo pin 620*i* is designated as the first designated distance T1, the impedance transferred from the (5-1)$^{th}$ pad 551*e* to the (5-2)$^{th}$ pad 551*i* becomes infinite, and thus it is possible to perform lossless measurement.

Referring to Equation 1, in the state in which the (5-1)$^{th}$ pogo pin 620*e* is grounded to the (5-1)$^{th}$ pad 551*e*, the (5-2)$^{th}$ pogo pin 620*i* is grounded to the (5-2)$^{th}$ pad, and the sixth pogo pin 620*f* is grounded to the sixth pad 551*f*, it can be seen that the impedance transferred from the (5-1)$^{th}$ pad 551*e* to the (5-2)$^{th}$ pad 551*i* becomes infinite. Thereby, it is possible to provide a lossless measurement amount of a signal transmitted from the connector.

Figure 11:
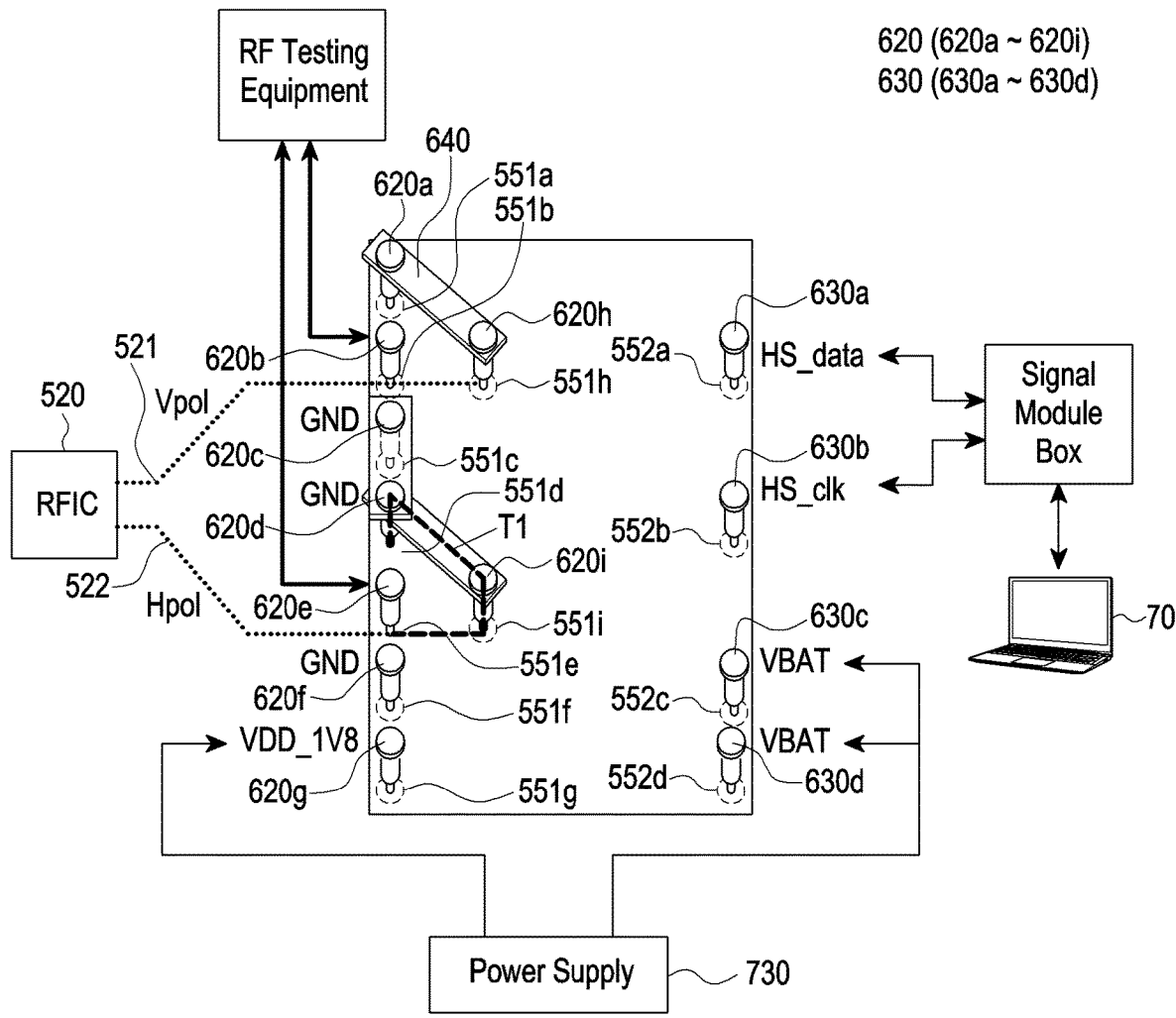
FIG. 11 is a diagram illustrating an example area in which conductive pads connected to RF measurement equipment are arranged according to various embodiments.

FIG. 11 is a diagram illustrating an example area, in which conductive pads connected to RF measurement equipment are arranged according to various embodiments.

According to various embodiments, conductive pads 550 including multiple pads may be formed in the second region S2 of the board 510 to be connected to RF measurement equipment 610. The conductive pads 550 may include first-row pads 551 and second-row pads 552 on opposite sides of the connector 530. Some or all of the structures of the first-row pads 551 and the second-row pads 552 of the conductive pads 550 in FIG. 10 are the same as those of the first-row pads 551 and the second-row pads 552 of the conductive pads 550 in FIG. 6.

According to various embodiments, the communication circuit 520 disposed in an area (e.g., the first area S1) of the board 510 may be electrically connected to the connector 530 and conductive pads 550 through a conductive line. According to an embodiment, the first-row pads 551 may include second pads 551*b* and 551*h*, a third pad 551*c*, a fourth pad 551*d*, fifth pads 551*e* and 551*i*, a sixth pad 551*f*, and a seventh pad 551*g* in one direction (e.g., the Y-axis direction) with reference to a first pad 551*a* corresponding to a ground 531*b*, 531*c*, or 531*f* among the contacts 531*a* to 531*h* of the first row. The second pads 551*b* and 551*h* may be spaced apart from each other to correspond to the IF1(RF1) 531*b*, and may be electrically connected to the first conductive line 521 of the communication circuit 520. The fifth pads 551*e* and 551*i* may be spaced apart from each other to correspond to the IF2(RF2) 531*e*, and may be electrically connected to the second conductive line 522 of the communication circuit 520.

Since the configuration of the conductive patterns 550 in FIG. 11 may be the same as or similar to the configuration of the conductive patterns 550 in FIG. 9, differences therefrom will be mainly described.

According to an embodiment, the second pads 551*b* and 551*h* may include a (2-1)$^{th}$ pad 551*b* and a (2-2)$^{th}$ pad 551*h* which are spaced apart from each other in a second direction (e.g., the X-axis direction) perpendicular to the first direction (e.g., the Y-axis direction). As another example, the fifth pads 551*e* and 551*i* may include a (5-1)$^{th}$ pad 551*e* and a (5-2)$^{th}$ pad 551*i* which are spaced apart from each other in a second direction (e.g., the X-axis direction) perpendicular to the first direction (e.g., the Y-axis direction). The (2-1)$^{th}$ pad 551*b* and the (5-1)$^{th}$ pad 551*e* may be arranged on the same line as other pads (e.g., the first pad 551*a*, the third pad 551*c*, the fourth pad 551*d*, the sixth pad 551*f*, and the seventh pad 551*g*), and the (2-2)$^{th}$ pad 551*h* and the (5-2)$^{th}$ pad 551*i* may not be arranged on the same line as the other pads.

According to various embodiments, the RF measurement equipment 610 includes multiple pogo pins 620 and 630, and the multiple pogo pins 620 and 630 may be brought into contact with the conductive pads, respectively, so as to measure an RF signal flow. The number of provided multiple pogo pins 620 and 630 may correspond to the number of the conductive pads 550 that come into contact with the conductive pads 550, respectively, and the multiple pogo pins may include a first pogo pin 620*a* that comes into contact with the first pad 551*a*, second pogo pins 620*b* and 620*h* that come into contact with the second pads 551*b* and 551*h*, a third pogo pin 620*c* that comes into contact with the third pad 551*c*, a fourth pogo pin 620*d* that comes into contact with the fourth pad 551*d*, fifth pogo pins 620*e* and 620*i* that come into contact with the fifth pads 551*e* and 551*i*, a sixth pogo pin 620*f* that comes into contact with the sixth pad 551*f*, and a seventh pogo pin 620*g* that comes into contact with the seventh pad 551*g*. The second pogo pins 620*b* and 620*h* may include a (2-1)$^{th}$ pogo pin 620*b* that comes into contact with the (2-1)$^{th}$ pad 551*b* and a (2-2)$^{th}$ pogo pin 620*h* that comes into contact with the (2-2)$^{th}$ pad 551*h*. The fifth pogo pins 620*e* and 620*i* may include a (5-1)$^{th}$ pogo pin 620*e* that comes into contact with the (5-1)$^{th}$ pad 551*e* and a (5-2)$^{th}$ pogo pin 620*i* that comes into contact with the (5-2)$^{th}$ pad 551*i*.

According to an embodiment, some of the pogo pins 620 and 630 of the RF measurement equipment 610 are directly connected to the RF measurement equipment 610 to provide an electrical flow during contact with a testing pad. The $(2\text{-}1)^{th}$ pogo pin 620b of the pogo pins 620 and 630 may come into contact with the $(2\text{-}1)^{th}$ pad 551b connected to the vertical polarization pole. The $(5\text{-}1)^{th}$ pogo pin 620e may come into contact with the $(5\text{-}1)^{th}$ pad 551e connected to the horizontal polarization pole.

According to an embodiment, the pogo pins 620 and 630 of the RF measurement equipment 610 may be arranged to contact the pads, respectively, and conductive members 640 forming a conductive line may be disposed between the pogo pins 620 and 630. Each of the conductive members 640 may have a plate shape and may be electrically connected to a corresponding pogo pin. For example, the conductive members 640 may include a third conductive member 640 and a fourth conductive member 640, which are spaced apart from each other, and may be disposed such that the $(2\text{-}2)^{th}$ pogo pin 620h and the first pogo pin 620a are connected to each other through the third conductive member 640. As another example, the conductive members 640 may be disposed such that the $(5\text{-}2)^{th}$ pogo pin 620i is connected to the third pogo pin 610c via the fourth pogo pin 620d through the fourth conductive member 640.

According to various embodiments, the distance between the pads and the distance between the pogo pins, which are in contact with the pads, may be adjusted in order to accurately measure an RF signal of the conductive pads 550 including multiple pads connected to the RF measurement equipment 610.

According to an embodiment, it is possible to adjust the distance between the $(5\text{-}2)^{th}$ pad 551i and the ground adjacent thereto. In consideration of the connection state of the RF measurement equipment 610 with the pogo pins, the sum of i) the distance between the $(5\text{-}1)^{th}$ pad and the $(5\text{-}2)^{th}$ pad, ii) the distance between the $(5\text{-}2)^{th}$ pad 551i and the fourth pad 551d connected to the adjacent ground (the distance between the $(5\text{-}2)^{th}$ pogo pin 620i and the fourth pogo pin 620d), iii) the length of the $(5\text{-}2)^{th}$ pogo pin 620i that comes into contact with the $(5\text{-}2)^{th}$ pad 551i, and iv) the length of the fourth pogo pin 620d that comes into contact with the fourth pad 551d may be formed to have the first designated distance T1. The first designated distance T1 may be $(1+2n)\lambda/4$, wherein n may be an integer that is not smaller than 0.

According to an embodiment, when the distance from the $(5\text{-}1)^{th}$ pad 551e to the fourth conductive member, the fourth pogo pin 620d, and the fourth pad 551d via the $(5\text{-}2)^{th}$ pad 551i and the $(5\text{-}2)^{th}$ pogo pin 620i is designated as the first designated distance T1, the impedance directed from the $(5\text{-}1)^{th}$ pad 551e to the $(5\text{-}2)^{th}$ pad 551i becomes infinite, and thus it is possible to perform lossless measurement.

Referring to Equation 1, in the state in which the $(5\text{-}1)^{th}$ pogo pin 620e is grounded to the $(5\text{-}1)^{th}$ pad 551e, the $(5\text{-}2)^{th}$ pogo pin 620i is grounded to the $(5\text{-}2)^{th}$ pad, and the sixth pogo pin 620f is grounded to the sixth pad 551f, it can be seen that the impedance directed from the $(5\text{-}1)^{th}$ pad 551e to the $(5\text{-}2)^{th}$ pad 551i becomes infinite. Thereby, it is possible to provide a lossless measurement amount of a signal transmitted from the connector.

According to various embodiments, the wavelength $\lambda$ used for the first designated distance T1 and the second specified distance T2 may indicate loss minimization at a designated frequency value. The following tables (Tables 1 to 6) are tables each comparing insertion losses in different frequency ranges depending on the wavelength. The insertion loss may indicate the quality of a transmitted signal and the bandwidth of a connector itself, and, the bandwidth is possible to understand as the highest data rate that the connector can transmit and/or receive.

TABLE 1

Port 3: Impedance to 0.01 ohm

| Port 1/Port 3 | Insertion Loss (dB)_S21 | | Isolation (dB)_S31 | | Isolation (dB)_S32 | |
|---|---|---|---|---|---|---|
| Trace Length | 28 GHz | 39 GHz | 28 GHz | 39 GHz | 28 GHz | 39 GHz |
| $\lambda/4$ | −0.94 | −1.19 | −36.55 | −36.34 | −36.56 | −36.63 |
| $2\lambda/4$ | −4.85 | −1.19 | −33.01 | −34.86 | −33.18 | −35.02 |
| $3\lambda/4$ | −2.15 | −3.70 | −36.09 | −34.57 | −35.90 | −34.67 |
| $\lambda$ | −2.42 | −2.18 | −35.78 | −37.48 | −35.67 | −36.94 |

TABLE 2

Port 3: Impedance to 5000 ohm

| Port 1/Port 3 | Insertion Loss (dB)_S21 | | Isolation (dB)_S31 | | Isolation (dB)_S32 | |
|---|---|---|---|---|---|---|
| Trace Length | 28 GHz | 39 GHz | 28 GHz | 39 GHz | 28 GHz | 39 GHz |
| $\lambda/4$ | −8.68 | −8.30 | −15.91 | −16.34 | −15.93 | −16.62 |
| $2\lambda/4$ | −1.51 | −1.72 | −20.11 | −19.45 | −20.25 | −19.68 |
| $3\lambda/4$ | −2.89 | −2.60 | −18.42 | −19.92 | −18.21 | −20.02 |
| $\lambda$ | −3.27 | −7.71 | −18.95 | −17.77 | −18.84 | −17.21 |

From Table 1 and Table 2, it is possible to confirm insertion loss values corresponding to distances from Port 1 to Port 3, and, from each of Table 1 and Table 2, it is possible to confirm that different impedance values are set at Port 3. From Table 1 and Table 2, when a wavelength $\lambda$ is 5.29 mm, it is possible to confirm insertion loss values at frequencies of about 28 GHz and 39 GHz. The distance from Port 1 to Port 3 may be the first designated distance T1 in FIGS. 10 and 11, Port 1 may be the $(5\text{-}2)^{th}$ pad 551e in FIG. 10, and Port 3 may be the sixth pad 551f in FIG. 10. Table 1 shows measurement values according to an embodiment of the disclosure in which the impedance of Port 3 is set to 0.01 ohms, and Table 2 shows measurement values of a comparative example in which the impedance of Port 3 is set to 5,000 ohms. When comparing Table 1 and Table 2, it is possible to confirm that according to an embodiment of the disclosure, in Table 1 in which the impedance of Port 3 is set to 0.01 ohms, when the distance from Port 1 to Port 3 is set to $\lambda/4$, the insertion loss in the frequency area of the 28 GHz band is −0.94, and the insertion loss in the frequency area of the 39 GHz band is −1.19. When comparing Table 1 and Table 2, it is possible to confirm a high data rate that can be transmitted by the connector due to a relatively low insertion loss. In particular, it is possible to confirm that the insertion loss is measured very low such that more efficient data can be confirmed in the frequency area of the 28 GHz band.

TABLE 3

Port 3: Impedance to 0.01 ohm

| Port 1/Port 3 | Insertion Loss (dB)_S21 | | Isolation (dB)_S31 | | Isolation (dB)_S32 | |
|---|---|---|---|---|---|---|
| Trace Length | 28 GHz | 39 GHz | 28 GHz | 39 GHz | 28 GHz | 39 GHz |
| $\lambda/4$ | −1.05 | −0.89 | −36.02 | −36.83 | −36.21 | −36.79 |
| $2\lambda/4$ | −1.93 | −15.44 | −34.83 | −32.15 | −35.06 | −32.30 |
| $3\lambda/4$ | −6.51 | −1.45 | −33.23 | −37.30 | −33.35 | −37.02 |
| $\lambda$ | −1.29 | −10.76 | −37.01 | −33.41 | −36.81 | −33.20 |

TABLE 4

Port 3: Impedance to 5000 ohm

| Port 1/Port 3 Trace Length | Insertion Loss (dB)_S21 | | Isolation (dB)_S31 | | Isolation (dB)_S32 | |
|---|---|---|---|---|---|---|
| | 28 GHz | 39 GHz | 28 GHz | 39 GHz | 28 GHz | 39 GHz |
| λ/4 | −4.52 | −26.59 | −16.55 | −15.50 | −16.70 | −15.47 |
| 2λ/4 | −2.58 | −1.23 | −18.45 | −20.77 | −18.68 | −20.87 |
| 3λ/4 | −1.19 | −14.49 | −20.20 | −16.52 | −20.25 | −16.24 |
| λ | −16.65 | −1.63 | −16.44 | −21.14 | −16.25 | −20.92 |

From Table 3 and Table 4, it is possible to confirm insertion loss values corresponding to distances from Port 1 to Port 3, and, from each of Table 3 and Table 4, it is possible to confirm that different impedance values are set at Port 3. From Table 3 and Table 4, when a wavelength λ is 4.54 mm, it is possible to confirm insertion loss values at frequencies of about 28 GHz and 39 GHz. The distance from Port 1 to Port 3 may be the first designated distance in FIGS. 10 and 11, Port 1 may be the (5-2)$^{th}$ pad 551e in FIG. 10, and Port 3 may be the sixth pad 551f in FIG. 10. Table 3 shows measurement values according to an embodiment of the disclosure in which the impedance of Port 3 is set to 0.01 ohms, and Table 4 shows measurement values of a comparative example in which the impedance of Port 3 is set to 5,000 ohms. When comparing Table 3 and Table 4, it is possible to confirm that according to an embodiment of the disclosure, in Table 3 in which the impedance of Port 3 is set to 0.01 ohms, when the distance from Port 1 to Port 3 is set to λ/4, the insertion loss in the frequency area of the 28 GHz band is −1.05, and the insertion loss in the frequency area of the 39 GHz band is −0.89. When comparing with Table 4, it is possible to confirm a high data rate that can be transmitted by the connector due to a relatively low insertion loss. For example, when the frequency area of the 28 GHz band and the frequency area of the 39 GHz band are selectively applied according to the situation, it is possible to expect efficiency when the wavelengths are used.

TABLE 5

Port 3: Impedance to 0.01 ohm

| Port 1/Port 3 Trace Length | Insertion Loss (dB)_S21 | | Isolation (dB)_S31 | | Isolation (dB)_S32 | |
|---|---|---|---|---|---|---|
| | 28 GHz | 39 GHz | 28 GHz | 39 GHz | 28 GHz | 39 GHz |
| λ/4 | −1.46 | −0.96 | −35.52 | −36.79 | −35.68 | −36.56 |
| 2λ/4 | −0.86 | −4.53 | −36.03 | −33.05 | −36.11 | −32.99 |
| 3λ/4 | −9.26 | −2.09 | −32.05 | −36.33 | −32.23 | −35.89 |
| λ | −2.81 | −2.13 | −35.28 | −36.08 | −35.17 | −35.66 |

TABLE 6

Port 3: Impedance to 5000 ohm

| Port 1/Port 3 Trace Length | Insertion Loss (dB)_S21 | | Isolation (dB)_S31 | | Isolation (dB)_S32 | |
|---|---|---|---|---|---|---|
| | 28 GHz | 39 GHz | 28 GHz | 39 GHz | 28 GHz | 39 GHz |
| λ/4 | −2.38 | −8.03 | −17.36 | −15.92 | −17.54 | −15.75 |
| 2λ/4 | −6.46 | −1.39 | −16.67 | −20.23 | −16.76 | −20.21 |
| 3λ/4 | −1.11 | −2.48 | −20.37 | −18.60 | −20.56 | −18.11 |
| λ | −1.85 | −3.34 | −19.03 | −18.89 | −18.92 | −18.46 |

From Table 5 and Table 6, it is possible to confirm insertion loss values corresponding to distances from Port 1 to Port 3, and, from each of Table 5 and Table 6, it is possible to confirm that different impedance values are set at Port 3. From Table 5 and Table 6, when a wavelength λ is 3.79 mm, it is possible to confirm insertion loss values at frequencies of about 28 GHz and 39 GHz. The distance from Port 1 to Port 3 may be the first designated distance in FIGS. 10 and 11, Port 1 may be the (5-2)$^{th}$ pad 551e in FIG. 10, and Port 3 may be the sixth pad 551f in FIG. 10. Table 5 shows measurement values according to an embodiment of the disclosure in which the impedance of Port 3 is set to 0.01 ohms, and Table 6 shows measurement values of a comparative example in which the impedance of Port 3 is set to 5,000 ohms. When comparing Table 5 and Table 6, it is possible to confirm that according to an embodiment of the disclosure, in Table 5 in which the impedance of Port 3 is set to 0.01 ohms, when the distance from Port 1 to Port 3 is set to λ/4, the insertion loss in the frequency area of the 28 GHz band is −1.46, and the insertion loss in the frequency area of the 39 GHz band is −0.96. When comparing with Table 6, it is possible to confirm a high data rate that can be transmitted by the connector due to a relatively low insertion loss. In particular, it is possible to confirm that the insertion loss is measured very low such that more efficient data can be confirmed in the frequency area of the 39 GHz band.

Figure 12:
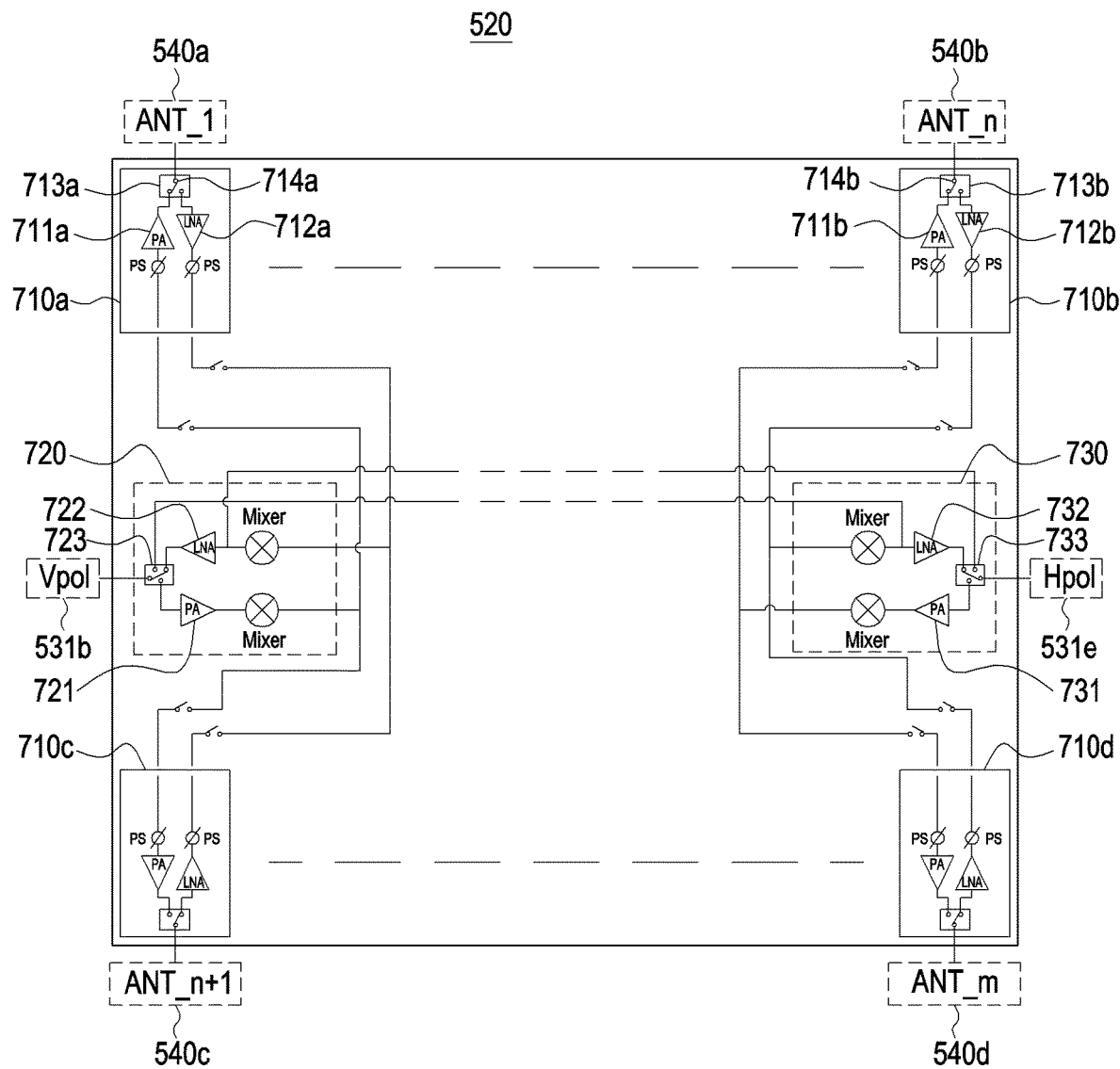
FIG. 12 is a diagram illustrating an internal circuit diagram of an example communication structure disposed inside a board according to various embodiments.
Figure 13:
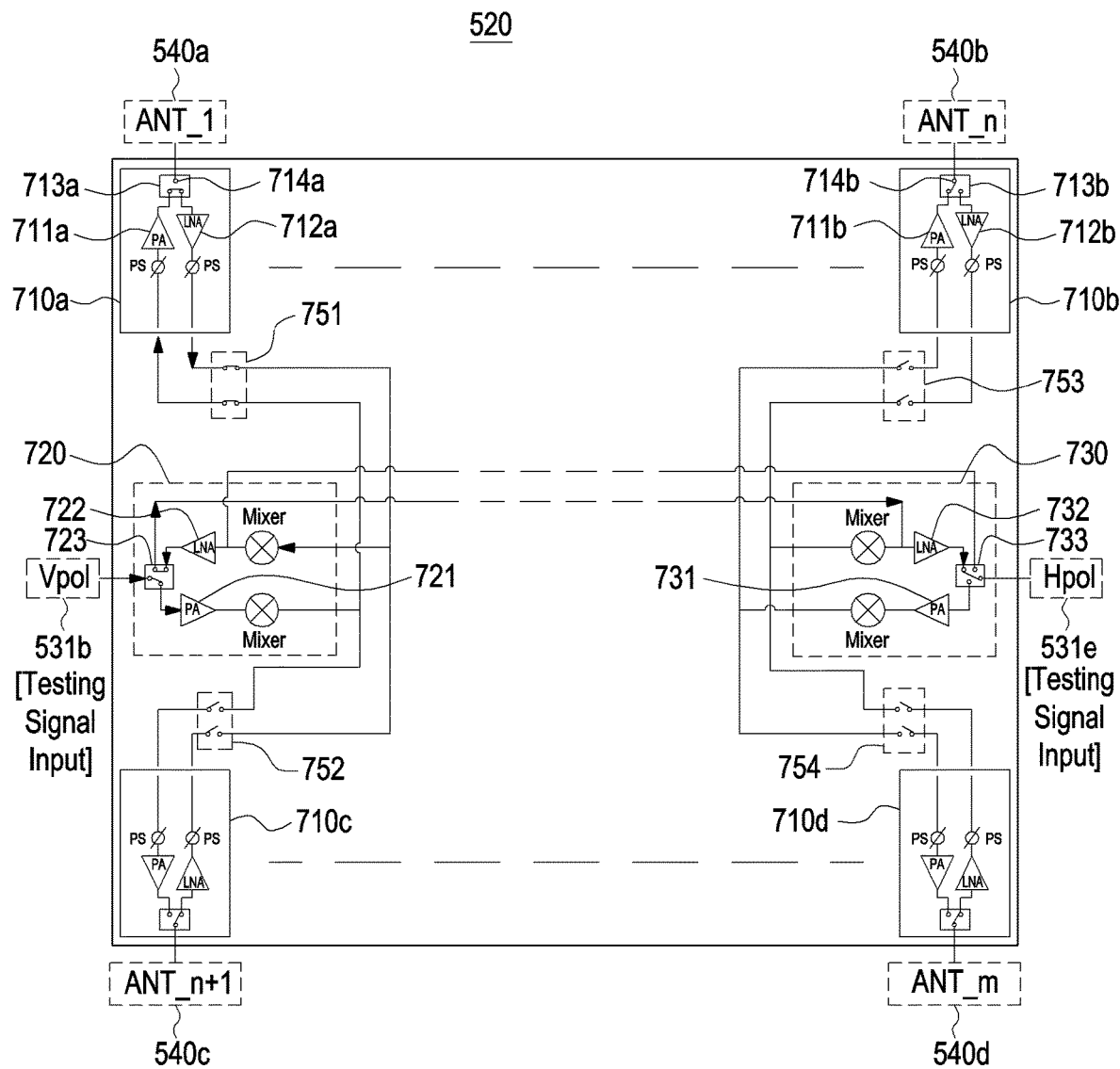
FIG. 13 is a diagram illustrating a circuit flow inside an example communication module when a communication structure disposed inside a board and RF measurement equipment are connected according to an embodiment of the disclosure.
Figure 14:
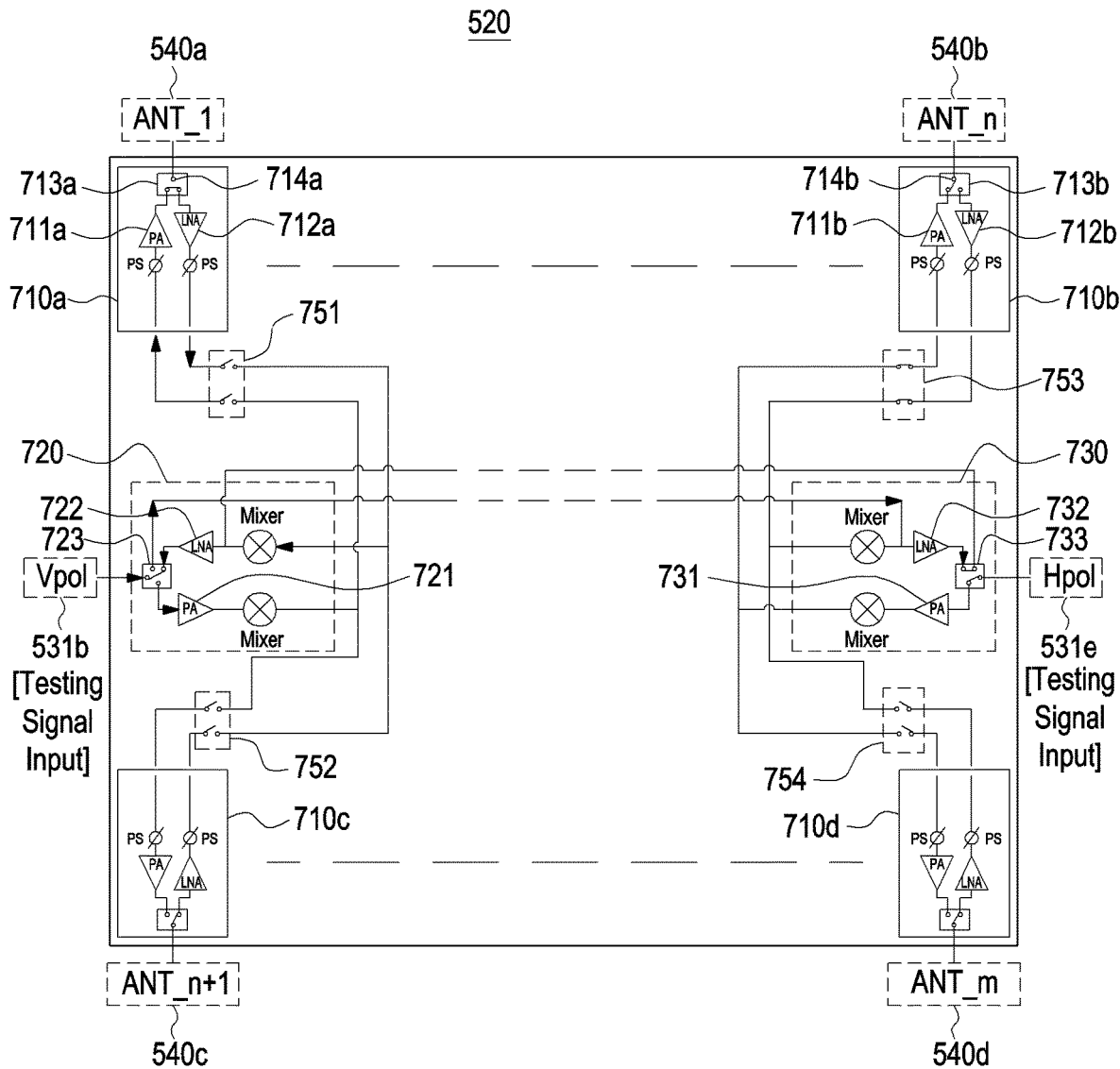
FIG. 14 is a diagram illustrating a circuit flow inside an example communication module when a communication structure disposed inside a board and RF measurement equipment are connected according to another embodiment of the disclosure.
Figure 15:
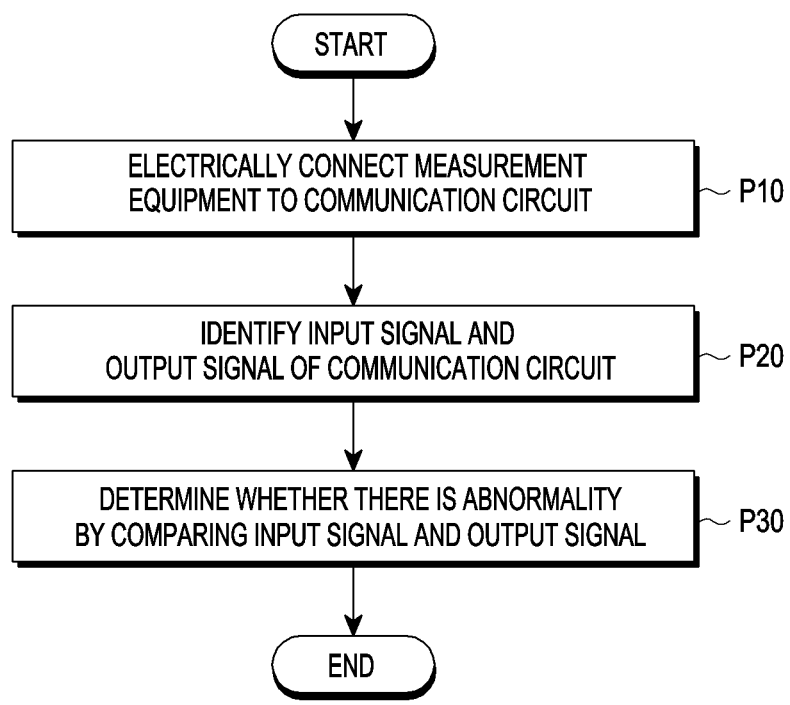
FIG. 15 is a flowchart illustrating an example operation of measurement equipment according to an embodiment.

FIG. 12 is a diagram illustrating an example internal circuit diagram of a communication structure disposed inside a board according to various embodiments; FIG. 13 is a diagram illustrating example circuit flow inside a communication module when a communication structure disposed inside a board and RF measurement equipment are connected according to an embodiment of the disclosure; FIG. 14 is a diagram illustrating example circuit flow inside a communication module when a communication structure disposed inside a board and RF measurement equipment are connected according to another embodiment of the disclosure; and FIG. 15 is a flowchart illustrating an example operation of measurement equipment according to an embodiment.

According to various embodiments, the communication circuit 520 is disposed in an area of the board (e.g., the board 510 in FIG. 6), and the communication circuit 520 may be electrically connected to an antenna 540 disposed in the adjacent area. The communication structure may be the first RFIC 222, the second RFIC 224, the third RFIC 226, or the fourth RFIC 228. Some or all the structures of the communication circuit 520 and the antenna 540a, 540b, 540c, or 540d in FIGS. 12 to 14 may be the same as those of the communication circuit 520 and the antenna 540 in FIGS. 6 to 8.

Referring to FIG. 12, the communication circuit 520 may include communication blocks 710a, 710b, 710c, and 710d that are electrically connected to multiple antennas 540a, 540b, 540c, and 540d, respectively. As another example, the communication circuit 520 may include a first connection block 720, which is electrically connected to IF1(RF1) 531b of a connector (e.g., the connector 530 in FIG. 6) and a second connection block 730, which is electrically connected to the IF2(RF2) 531e of the connector 530.

According to various embodiments, the multiple communication blocks 710a, 710b, 710c, and 710d may include a first communication block 710a connected to the first antenna 540a, a second communication block 710b connected to the second antenna 540b, a third communication block 710c connected to the third antenna 540c, and a fourth communication block 710d connected to the fourth antenna 540c. Respective communication blocks 710a, 710b, 710c, and 710d may have the same structure.

According to various embodiments, the first communication block 710a may include a first terminal 714a, a first power amp module (PAM) 711a, a first low-noise amplifier (LNA) 712a, and a first switch 713a, which are connected to the first antenna 540a. Meanwhile, although not illustrated in FIG. 12, the first communication block 710a may further include a coupler.

According to an embodiment, the first antenna 540a may transmit power or a signal to the outside or may receive power or signals from the outside, and the first PAM 711a may amplify the intensity of power or the intensity of a signal to be transmitted to the outside from the first communication block 710a. The first LNA 712a may reduce the noise of the power or signal received from the outside and may amplify the intensity of the signal or power received from the outside, and the first switch 713a may selectively connect a transmission path or a reception path of the first communication block 710a. For example, when the first switch 713a connects the first antenna 540a and the first PAM 711a to each other, the first antenna 540a may transmit power or a signal to the outside, and when the first switch 713a connects the first antenna 540a and the first LNA 712a to each other, the first antenna 540a may receive power or a signal from the outside.

According to various embodiments, the second communication block 710b may include a second terminal 714b, a second PAM 711b, a second LNA 712b, and a second switch 713b, which are disposed at different positions from those in the first communication block 710a and are connected to the second antenna 540b.

According to an embodiment, the second antenna 540b of the second communication block 710b may transmit and receive signals in a frequency band different from that of the signals transmitted and received by the first antenna 540a. The configurations of the second PAM 711b, the second LNA 712b, and the second switch 713b of the second communication block 710b may be similar to or the same as those of the first PAM 711a, the first LNA 712a, and the first switch 713a of the first communication block 710a.

According to an embodiment, each of the third communication block 710c connected to the third antenna 540c and the fourth communication block 710d connected to the fourth antenna 540c may include a PAM, an LNA, and a switch 334, which performs the same functions as the first PAM 711a, the first LNA 712a, and the first switch 713a, respectively. Thus, a redundant description in this regard will be omitted.

According to various embodiments, the communication circuit 520 may include a first connection block 720, which is electrically connected to the IF1(RF1) 531b of the connector 530, and a second connection block 730, which is electrically connected to the IF2(RF2) 531e of the connector 530.

According to an embodiment, the first connection block 720 may include a third terminal, a third PAM 721, a third LNA 722, and a third switch 723, which are electrically connected to the IF1(RF1) 531b. The second connection block 730 may include a fourth terminal, a fourth PAM 731, a fourth LNA 732, and a fourth switch 733, which are electrically connected to the IF2(RF2) 531e.

Referring to FIGS. 13 and 15, an electrical flow in the communication circuit 520 is illustrated when the RF measurement equipment 610 is connected to the IF1(RF1) 531b and the IF2(RF2) 531e. As illustrated in FIGS. 13 and 15, a flow of RF signals connected to the first antenna 540a may be provided. According to various embodiments, the measurement equipment (e.g., the RF measurement equipment 610 in FIGS. 9 to 11) may determine whether or not the communication circuit 520 connected to the first antenna 540a is defective and whether an amount of deviation is acceptable. However, FIG. 15 is not limited to the case in which the RF measurement equipment 610 is connected to the first antenna 540a, and FIG. 15 is also applicable to the case in which the RF measurement equipment 610 is connected to the second antenna 540b of FIG. 12, the case in which the RF measurement equipment 610 is connected to the third antenna 540c, or the case in which the RF measurement equipment 610 is connected to the fourth antenna 540c.

According to various embodiments, the RF measurement equipment 610 may be electrically connected to the contacts of a connector (P10 in FIG. 15) (e.g., the connector 530 in FIG. 6). For example, the multiple pogo pins of the RF measurement equipment 610 may be respectively grounded with conductive pads electrically connected to respective contacts of the connector. When an input signal is transmitted to the IF1(RF1) 531b connected to the RF measurement equipment 610 after the grounding is performed, the signal may move to the IF2(RF2) 531e via the first connection block 720, the first antenna 540a, and the second connection block 730, and an output signal may be provided to the RF measurement equipment 610. For example, the input signal transmitted to the IF1(RF1) 531b may be transmitted to the third PA 721 by the third switch 723, and may then be provided to the first communication block 710a connected to the first antenna 540a. Whether to select the third switch 723 may be determined by an external command from an external measurement equipment. As another example, the measurement equipment may make a determination such that a switch (e.g., the switch 751) between communicating communication circuits determined to measure some of the multiple antennas is connected, and may perform control such that switches (e.g., the switches 752, 753, and 754) connectable to the other antennas are not connected. The transmitted signal may be provided to the first antenna 540a via the first PA 711a and the first switch 713a in the first communication block 710a. The signal received by the first antenna 540a may be provided to the first LNA 712a through the first switch 713a and may be transmitted to the third LNA 722. Thereafter, the signal may then be transmitted to the second connection block 730 via the third LNA 722 and the third switch 723 of the first connection block 720. The signal transmitted to the fourth LNA 732 and the fourth switch 733 of the second connection block 730 may be connected to the IF2(RF2) 531e, and an output signal may be transmitted to the RF measurement equipment 610 connected to the IF2(RF2) 531e.

According to various embodiments, the RF measurement equipment 610 receiving the output signal may identify the input signal and the output signal (P20 in FIG. 15). For example, on the basis of the input signal to the IF1(RF1) 531b described above, each output signal of IF2(RF2) 531e received from the first antenna 540a may be identified.

Thereafter, the RF measurement equipment 610 compares the two signals (e.g., the input signal and the output signal) to determine whether there is an abnormality in the communication circuit 520 connected to the first antenna 540a (P30 in FIG. 15). For example, it is possible to determine whether or not the communication circuit 520 is defective, whether an amount of deviation is acceptable, or to identify the degree of signal loss (e.g., the insertion loss of a designated frequency band). Referring to FIG. 14, an electrical flow in the communication circuit 520 is illustrated when the RF measurement equipment 610 is connected to the IF1(RF1) 531*b* and the IF2(RF2) 531*e*. As illustrated in FIG. 14, a flow of RF signals connected to the second antenna 540*b* may be provided. According to the flow of the RF signals according to FIG. 14, the input signal and the output signal may be provided inversely unlike what is illustrated in FIG. 13.

According to various embodiments, when an input signal is transmitted to the IF2(RF2) 531*e* connected to the RF measurement equipment 610, the signal may move to the IF1(RF1) 531*b* via the second connection block 730, the second antenna 540*a*, and the first connection block 720, and an output signal may be provided to the RF measurement equipment 610. For example, the input signal transmitted to the IF2(RF2) 531*e* may be transmitted to the fourth PA 731 by the fourth switch 733, and may then be provided to the second communication block 710*b* connected to the second antenna. Whether to select the fourth switch 733 may be determined by an external command from a piece of external measurement equipment. As another example, the measurement equipment may make a determination such that a switch (e.g., the switch 753) between communicating communication circuits determined to measure some of the multiple antennas is connected, and may perform control such that switches (e.g., the switches 751, 752, and 754) connectable to the other antennas are not connected. The transmitted signal may be provided to the second antenna 540*a* via the second PA 711*a* and the second switch 713*a* in the second communication block 710*b*. The signal received by the second antenna 540*b* may be provided to the second LNA 712*b* through the second switch 713*b*, and may be transmitted to the fourth LNA 722. Thereafter, the signal may then be transmitted to the first connection block 720 via the fourth LNA 732 and the fourth switch 733 of the second connection block 730. The signal transmitted to the first LNA 712*a* and the first switch 713*a* of the first connection block 720 may be connected to the IF2(RF2) 531*e*, and an output signal may be transmitted to the RF measurement equipment 610 connected to the IF1(RF1) 531*b*.

FIG. 15 is a flowchart illustrating an example operation of measurement equipment according to an embodiment.

In operation P10, the RF measurement equipment 610 may be electrically connected to the contacts of a connector (e.g., the connector 530 in FIG. 6).

In operation P20 the RF measurement equipment 610 receiving the output signal may identify the input signal and the output signal. For example, on the basis of the input signal to the IF1(RF1) 531*b* described above, each output signal of IF2(RF2) 531*e* received from the first antenna 540*a* may be identified.

In operation P30 the RF measurement equipment 610 compares the two signals (e.g., the input signal and the output signal) to determine whether there is an abnormality in the communication circuit 520 connected to the first antenna 540*a*.

An electronic device (e.g., the electronic device 101 in FIGS. 1 to 5) according to various embodiments may include: a board (e.g., the board 510 in FIG. 6A); a communication circuit (e.g., the communication circuit 520 in FIG. 6A) disposed on one face of the board and configured to process a communication signal in a designated frequency band; an antenna (e.g., the antenna 540 in FIG. 6A or FIG. 6B) disposed on the one face of the board or inside the board; a connector (e.g., the connector 530 in FIG. 6A) disposed on another face of the board, and including a first contact (e.g., the IF1(RF1) 531*b* in FIG. 6A) electrically connected to a first signal path, through which the communication circuit configured to transmit a signal to the antenna in a first direction, and a second contact (e.g., the IF2(RF2) 531*e* in FIG. 6A) electrically connected to a second signal path, through which the communication circuit configured to transmit a signal to the antenna in a second direction; and conductive pads disposed on the another face of the board to be spaced apart from the connector, the conductive pads including at least two first pads (e.g., the second pads 551*b* and 551*h* in FIG. 6A) corresponding to the first contact and at least two second pads (e.g., the fifth pads 551*e* and 551*i* in FIG. 6A) corresponding to the second contact.

According to various embodiments, the connector may further include at least one ground contact (e.g., the $(1\text{-}1)^{th}$, the $(1\text{-}2)^{th}$, the $(1\text{-}3)^{th}$, or the $(1\text{-}4)^{th}$ ground 531*a*, 531*c*, 531*d*, or 531*f* in FIG. 6A) disposed adjacent to the first contact and the second contact, and the conductive pads may further include at least one ground pad (e.g., the first, third, fourth, and six pads 551*a*, 551*c*, 551*d*, and 551*f* in FIG. 6A) disposed adjacent to the first pads and the second pads to correspond to the at least one ground contact.

According to various embodiments, the first pads may include a $(1\text{-}1)^{th}$ conductive pad (e.g., the $2\text{-}1^{th}$ pad 551*b* in FIG. 6A) having a first separation distance (e.g., the first separation distance d1 in FIG. 6A) from the first contact and a $(1\text{-}2)^{th}$ conductive pad (e.g., the $(2\text{-}2)^{th}$ pad 551*h* in FIG. 6A) having a second separation distance (e.g., the second separation distance d2 in FIG. 6A) from the first contact, and the first separation distance and the second separation distance may be different from each other.

According to various embodiments, the second pads may include a $(2\text{-}1)^{th}$ conductive pad (e.g., the $(5\text{-}1)^{th}$ pad 551*e* in FIG. 6A) having a first separation distance from the second contact and a $(2\text{-}2)^{th}$ conductive pad (e.g., the (5-2)th pad 551*i* in FIG. 6A) having a second separation distance from the second contact, and the first separation distance and the second separation distance may be different from each other.

According to various embodiments, the ground contacts of the connector may further include a first ground contact (e.g., the $(1\text{-}2)^{th}$ and $(1\text{-}3)^{th}$ grounds 531*c* and 531*d* in FIG. 6A) disposed between the first contact and the second contact and a second ground contact (e.g., the $(1\text{-}1)^{th}$ and $(1\text{-}4)^{th}$ grounds 531*a* and 531*f* spaced apart from the first ground contact with the first contact interposed therebetween). The ground pads may include a first ground pad (e.g., the third and fourth pads 551*c* and 551*d* in FIG. 6A) electrically connected to the first ground contact and a second ground pad (e.g., the first and sixth pads 551*a* and 551*f* in FIG. 6A) electrically connected to the second ground contact, and the first ground pad and the second ground pad may be arranged on the same line as the first contact and the second contact.

According to various embodiments, the board may include a first area (e.g., the first area S1 in FIG. 6A) and a second area (e.g., the second area S2 in FIG. 6A) extending from the first area. The first area may include a partial area of a ground member including a ground, the communication structure, and the antenna, and the second area may include another area of the ground member and conductive pads including the multiple pads.

According to various embodiments, the connector may be electrically connected to a connector formed on another circuit board of the electronic device to provide a line that connects IF or RF power or a control signal or a line that transmits the communication signal between the circuit boards.

According to various embodiments, the antenna includes multiple conductive plates, and an array of the multiple conductive plates may form a periodic pattern, and may include a patch-type radiation conductor or a dipole-type radiation conductor.

According to various embodiments, the first contact may be electrically connected to some of the conductive plates to supply a signal directed in a first direction, and the second contact may be electrically connected to remaining ones of the conductive plates so as to supply a signal directed in a direction that is different from the first direction.

According to various embodiments, through the array of the conductive plates, a signal in the designated frequency band ranging from 6 GHz to 300 GHz may be transmitted and/or received.

According to various embodiments, when the $(1-1)^{th}$ conductive pad (e.g., the $(2-1)^{th}$ pad 551*b* in FIG. 9) is in contact with a $(1-1)^{th}$ probe (e.g., the $(2-1)^{th}$ pogo pin 620*b* in FIG. 9) of an external measurement apparatus, the $(1-2)^{th}$ conductive pad (e.g., the $(2-2)^{th}$ pad 551*h* in FIG. 9) is in contact with a $(1-2)^{th}$ probe (e.g., the $(2-2)^{th}$ pogo pin 620*h* in FIG. 9) of the external measurement apparatus, the first ground pad (e.g., the first pad 551*a* in FIG. 9) adjacent to the $(1-2)^{th}$ conductive pad is in contact with a second probe (e.g., the first pogo pin 620*a* in FIG. 9) of the external measurement apparatus, and the second ground pad (e.g., the third pad 551*c* in FIG. 9) adjacent to the $(1-2)^{th}$ conductive pad is in contact with a third probe (e.g., the third pogo pin 620*c* in FIG. 9) of the external measurement apparatus, a separation distance between the $(1-1)^{th}$ conductive pad and the $(1-2)^{th}$ conductive pad may form a first designated distance (the first designated distance T1 in FIG. 9), a distance from the $(1-2)^{th}$ conductive pad to the second probe and the first ground pad via the $(1-2)^{th}$ probe may form a second designated distance (e.g., the second designated distance T2 in FIG. 9), and a distance from the $(1-2)^{th}$ conductive pad to the third probe and the second ground pad via the $(1-2)^{th}$ probe may form a third designated distance (e.g., the third designated distance T3 in FIG. 9), and the second designated distance and the third designated distance may be equal to each other.

According to various embodiments, the first designated distance is $(1+2n)\lambda/4$ (n being an integer that is not smaller than 0), and the second designated distance is $m\lambda/2$ (m being an integer that is not smaller than 1).

According to various embodiments, when the $(1-1)^{th}$ conductive pad is in contact with a $(1-1)^{th}$ probe of an external measurement apparatus, the $(1-2)^{th}$ conductive pad is in contact with a $(1-2)^{th}$ probe of the external measurement apparatus, and the first ground pad adjacent to the $(1-2)^{th}$ conductive pad is in contact with a second probe of the external measurement apparatus, a distance from the $(1-1)^{th}$ conductive pad to the second probe and the first ground pad via the $(1-2)^{th}$ conductive pad and the $(1-2)^{th}$ probe may form a first designated distance, and the first designated distance may be $(1+2n)\lambda/4$ (n being an integer that is not smaller than 0).

An electronic device according to various embodiments may include: a board; a communication structure comprising communication circuitry disposed on one face of the board and configured to process a communication signal in a designated frequency band among multiple designated frequency bands corresponding to a designated communication method; an antenna disposed on another face of the board or inside the board, and including at least one conductive plate; a connector disposed on the one face of the board and electrically connected to the communication structure, the connector including a first contact configured to supply a signal to the antenna in a designated direction and a second contact configured to supply a signal to the antenna in a direction different from the designated direction; and conductive pads spaced apart from the connector and including a first pad electrically connected to the first contact of the connector and a second pad electrically connected to the second contact of the connector.

According to various embodiments, the connector may include a ground contact disposed adjacent to the first contact and the second contact, and the conductive pads may further include a ground pad electrically connected to the ground contact.

A measurement apparatus (e.g., the measurement apparatus 610 in FIG. 9) according to various embodiments may include: a first probe (e.g., the $(2-1)^{th}$ pogo pin 620*b* in FIG. 6A) configured to be electrically connected to a first terminal (e.g., the $(2-1)^{th}$ pad 551*b* in FIG. 6A) of an external electronic device (e.g., the electronic device 101 in FIGS. 1 to 5); a second probe (e.g., the $(2-2)^{th}$ pogo pin 620*h* in FIG. 6A) configured to be electrically connected to the first terminal and configured to be electrically connected to a second terminal (e.g., the $(2-2)^{th}$ pad 551*h* in FIG. 6A) of the external electronic device disposed adjacent to the first terminal; a third probe (e.g., the third pogo pin 620*e* in FIG. 6A) configured to be electrically connected to a third terminal (e.g., the $(5-1)^{th}$ pad 551*e* in FIG. 6A) of the external electronic device, which forms a signal path of a designated frequency band with the first terminal; a processor configured to: transmit a first signal in the designated frequency band through the first probe to the external electronic device, acquire, through the third probe, a second signal generated when the first signal passes through a signal path between the first terminal and the third terminal of the external electronic device, and determine whether or not the signal path is abnormal based on at least the first signal and the second signal; and one or more fourth probes (e.g., the third, fourth, or sixth pogo pin 620*c*, 620*d*, or 620*f*) configured to be connected to at least one ground terminal (e.g., the third, fourth, or sixth pad 551*c*, 551*d*, or 551*f* in FIG. 6A) corresponding to a ground area of the external electronic device. At least some of the fourth probes adjacent to the second probe among the one or more fourth probes may be electrically connected to the second probe so as to have a designated length corresponding to the designated frequency band.

According to various embodiments, the first probe may be in contact with the first terminal electrically connected to the connector of the external electronic device, the second probe may be in contact with the second terminal electrically connected to the connector of the external electronic device, the third probe may be in contact with the third terminal electrically connected to the connector of the external electronic device, and the one or more fourth probes may be in contact with the at least one ground terminal electrically connected to the connector of the external electronic device so as to determine whether or not the signal path of the external electronic device is abnormal.

According to various embodiments, multiple fourth probes may be provided, a $(4-1)^{th}$ probe may be connected to a first ground terminal and a $(4-2)^{th}$ probe may be connected to a second ground terminal so as to determine whether or not the signal path of the external electronic device is abnormal.

According to various embodiments, a separation distance between the first probe and the second probe may form a first designated distance, a distance from the second terminal to the $(4-1)^{th}$ probe and the first ground terminal via the second probe may form a second designated distance, and a distance from the second terminal to the (4-2)$^{th}$ probe and the second ground terminal via the second probe may form a third designated distance. The second designated distance and the third designated distance may be equal to each other.

According to various embodiments, the distance from the first terminal to the one or more fourth probes and the ground pad via the second probe may form a first designated distance, and the first designated distance may be (1+2n)λ/4 (n being an integer that is not smaller than 0).

While the disclosure has been illustrated with reference to various example embodiments, it will be understood by those skilled in the art that the various example embodiments are intended to be illustrative, not limiting, and that various changes in form and details may be made without departing from the true spirit and full scope of the disclosure.

What is claimed is:

1. An electronic device comprising:
a board;
a communication circuit disposed on one face of the board and configured to process a communication signal in a designated frequency band;
an antenna disposed on the one face of the board or inside the board;
a connector disposed on another face of the board and including a first contact electrically connected to a first signal path through which the communication circuit is configured to transmit a signal to the antenna in a first direction, and a second contact electrically connected to a second signal path through which the communication circuit is configured to transmit a signal to the antenna in a second direction; and
conductive pads disposed on the another face of the board and to be spaced apart from the connector, and including at least two first pads corresponding to the first contact and at least two second pads corresponding to the second contact.

2. The electronic device of claim 1, wherein the connector further includes at least one ground contact disposed adjacent to the first contact and the second contact, and
the conductive pads further include at least one ground pad disposed adjacent to the first pads and the second pads and corresponding to the at least one ground contact.

3. The electronic device of claim 2, wherein the first pads include a (1-1)$^{th}$ conductive pad having a first separation distance from the first contact and a (1-2)$^{th}$ conductive pad having a second separation distance from the first contact,
wherein the first separation distance and the second separation distance are different from each other.

4. The electronic device of claim 3, wherein the second pads include a (2-1)$^{th}$ conductive pad having a first separation distance from the second contact and a (2-2)$^{th}$ conductive pad having a second separation distance from the second contact,
wherein the first separation distance and the second separation distance are different from each other.

5. The electronic device of claim 4, wherein, based on the (1-1)$^{th}$ conductive pad being in contact with a (1-1)$^{th}$ probe of an external measurement apparatus, the (1-2)$^{th}$ conductive pad is in contact with a (1-2)$^{th}$ probe of the external measurement apparatus, the first ground pad adjacent to the (1-2)$^{th}$ conductive pad is in contact with a second probe of the external measurement apparatus, and the second ground pad adjacent to the (1-2)$^{th}$ conductive pad is in contact with a third probe of the external measurement apparatus, a separation distance between the (1-1)$^{th}$ conductive pad and the (1-2)$^{th}$ conductive pad defines a first designated distance, a distance from the (1-2)$^{th}$ conductive pad to the second probe and the first ground pad via the (1-2)$^{th}$ probe defines a second designated distance, and a distance from the (1-2)$^{th}$ conductive pad to the third probe and the second ground pad via the (1-2)$^{th}$ probe defines a third designated distance, and
wherein the second designated distance and the third designated distance are equal to each other.

6. The electronic device of claim 5, wherein the first designated distance is (1+2n)λ/4, wherein n is an integer not smaller than 0, and
the second designated distance is mλ/2, wherein m is an integer not smaller than 1.

7. The electronic device of claim 4, wherein, based on the (1-1)$^{th}$ conductive pad being in contact with a (1-1)$^{th}$ probe of an external measurement apparatus, the (1-2)$^{th}$ conductive pad is in contact with a (1-2)$^{th}$ probe of the external measurement apparatus, and the first ground pad adjacent to the (1-2)$^{th}$ conductive pad is in contact with a second probe of the external measurement apparatus, a distance from the (1-1)$^{th}$ conductive pad to the second probe and the first ground pad via the (1-2)$^{th}$ conductive pad and the (1-2)$^{th}$ probe defines a first designated distance, and the first designated distance is (1+2n)λ/4, wherein n is an integer not smaller than 0.

8. The electronic device of claim 2, wherein the ground contacts of the connector further include a first ground contact disposed between the first contact and the second contact and a second ground contact spaced apart from the first ground contact with the first contact interposed therebetween,
the ground pads include a first ground pad electrically connected to the first ground contact and a second ground pad electrically connected to the second ground contact, and
the first ground pad and the second ground pad are arranged on a same line as the first contact and the second contact.

9. The electronic device of claim 1, wherein the board includes a first area and a second area extending from the first area,
the first area includes a partial area of a ground member including a ground, the communication circuit, and the antenna, and
the second area includes another area of the ground member and the conductive pads.

10. The electronic device of claim 1, wherein the connector is electrically connected to a connector disposed on another circuit board of the electronic device to provide at least one of a line that connects IF or RF power, a control signal or a line configured to transmit the communication signal between the circuit boards.

11. The electronic device of claim 1, wherein the antenna includes multiple conductive plates, and
an array of the multiple conductive plates is arranged in a periodic pattern, and includes at least one of a patch-type radiation conductor or a dipole-type radiation conductor.

12. The electronic device of claim 11, wherein the first contact is electrically connected to some of the conductive plates to supply a signal directed in a first direction, and
the second contact is electrically connected to remaining ones of the conductive plates to supply a signal directed in a direction that is different from the first direction.

13. The electronic device of claim 11, wherein through the array of the conductive plates, a signal in the designated frequency band in a range of 6 GHz to 300 GHz is transmitted and/or received.

14. An electronic device comprising:
- a board;
- a communication structure comprising a communication circuit disposed on one face of the board and configured to process a communication signal in a designated frequency band among multiple designated frequency bands corresponding to a designated communication method;
- an antenna disposed on another face of the board or inside the board, and including at least one conductive plate;
- a connector disposed on the one face of the board and electrically connected to the communication structure, the connector including a first contact configured to supply a signal to the antenna in a designated direction and a second contact configured to supply a signal to the antenna in a direction different from the designated direction; and
- conductive pads spaced apart from the connector and including a first pad electrically connected to the first contact of the connector and a second pad electrically connected to the second contact.

15. The electronic device of claim 14, wherein the connector includes a ground contact disposed adjacent to the first contact and the second contact, and
the conductive pads further include a ground pad electrically connected to the ground contact.

16. A measurement apparatus comprising:
- a first probe configured to be electrically connected to a first terminal of an external electronic device;
- a second probe configured to be electrically connected to the first terminal and configured to be electrically connected to a second terminal of the external electronic device, the second terminal of the external device being disposed adjacent to the first terminal;
- a third probe configured to be electrically connected to a third terminal of the external electronic device, and defining a signal path of a designated frequency band with the first terminal;
- a processor configured to: transmit a first signal in the designated frequency band through the first probe to the external electronic device, acquire, through the third probe, a second signal generated based on the first signal passing through a signal path between the first terminal and the third terminal of the external electronic device, and determine whether the signal path is abnormal based on at least the first signal and the second signal; and
- one or more fourth probes configured to be connected to at least one ground terminal corresponding to a ground area of the external electronic device,
- wherein at least some of the fourth probes adjacent to the second probe among the one or more fourth probes are electrically connected to the second probe and having a designated length corresponding to the designated frequency band.

17. The measurement apparatus of claim 16, wherein the first probe is in contact with the first terminal electrically connected to the connector of the external electronic device, the second probe is in contact with the second terminal electrically connected to the connector of the external electronic device, the third probe is in contact with the third terminal electrically connected to the connector of the external electronic device, and the one or more fourth probes are in contact with the at least one ground terminal electrically connected to the connector of the external electronic device to determine whether the signal path of the external electronic device is abnormal.

18. The measurement apparatus of claim 17, wherein a plurality of fourth probes are provided, and
a $(4\text{-}1)^{th}$ probe is connected to a first ground terminal and a $(4\text{-}2)^{th}$ probe is connected to a second ground terminal to determine whether the signal path of the external electronic device is abnormal.

19. The measurement apparatus of claim 18, wherein a separation distance between the first probe and the second probe defines a first designated distance,
a distance from the second terminal to the $(4\text{-}1)^{th}$ probe and the first ground terminal via the second probe defines a second designated distance,
a distance from the second terminal to the $(4\text{-}2)^{th}$ probe and the second ground terminal via the second probe defines a third designated distance, and
the second designated distance and the third designated distance are equal to each other.

20. The measurement apparatus of claim 17, wherein a distance from the first terminal to the one or more fourth probes and the ground pad via the second terminal and the second probe defines a first designated distance, and
the first designated distance is $(1+2n)\lambda/4$, wherein n is an integer not smaller than 0.

* * * * *